United States Patent
Tenma et al.

(10) Patent No.: US 7,933,672 B2
(45) Date of Patent: Apr. 26, 2011

(54) SHAPE DETAILING DEVICE, SHAPE DETAILING METHOD, COMPUTER PROGRAM PRODUCT, MECHANICAL CAD MACHINE, AND METHOD OF MANUFACTURING THREE-DIMENSIONAL STRUCTURE

(75) Inventors: Tsukasa Tenma, Kawasaki (JP); Yuichi Arita, Kawasaki (JP); Akira Sakai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1093 days.

(21) Appl. No.: 11/698,853

(22) Filed: Jan. 29, 2007

(65) Prior Publication Data
US 2008/0189080 A1 Aug. 7, 2008

(30) Foreign Application Priority Data
Sep. 28, 2006 (JP) ................. 2006-265887

(51) Int. Cl.
*G06F 19/00* (2006.01)
*G06F 9/45* (2006.01)
(52) U.S. Cl. .......................... 700/97; 716/103
(58) Field of Classification Search .............. 700/97, 700/182, 194; 716/3, 103
See application file for complete search history.

(56) References Cited

U.S. PATENT DOCUMENTS
| | | | |
|---|---|---|---|
| 2002/0046387 A1* | 4/2002 | Matsushita et al. | 716/1 |
| 2002/0173867 A1* | 11/2002 | Duncan et al. | 700/97 |
| 2008/0079717 A1* | 4/2008 | Arita et al. | 345/419 |

FOREIGN PATENT DOCUMENTS
| | | |
|---|---|---|
| JP | 11-353341 | 12/1999 |
| JP | 2000-011012 | 1/2000 |
| JP | 2006-154983 | 6/2006 |

OTHER PUBLICATIONS

Feldmann, K., and Franke, J. "Computer-Aided Planning Systems for Integrated Electronic and Mechanical Design". IEEE Transactions on Components, Hybrids, and Manufacturing Technology 16.4 (1993): 377-383.*

Chinese Office Action corresponding Chinese Application 200710079283.3; issued Jul. 31, 2009.

* cited by examiner

*Primary Examiner* — Ryan A Jarrett
(74) *Attorney, Agent, or Firm* — Fujitsu Patent Center

(57) ABSTRACT

A shape detailing device includes a storage unit that stores therein an identifier of each structure in an electrical computer-aided design (CAD) system and an identifier of the structure in a mechanical CAD system associated with each other, and a converting unit that converts shape information of the structure created by the electrical CAD system into shape information for the mechanical CAD system based on the relation between the identifiers.

11 Claims, 21 Drawing Sheets

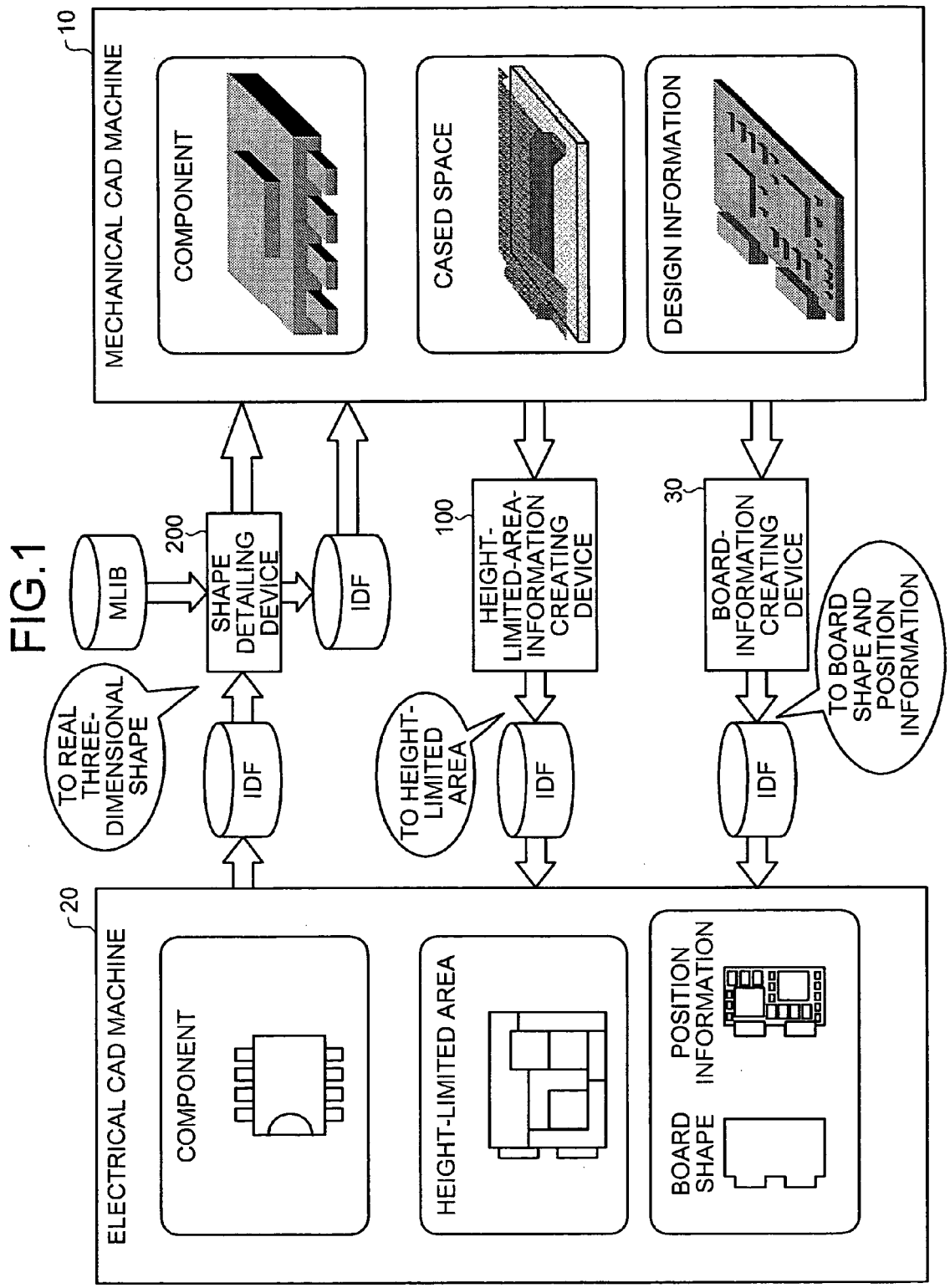

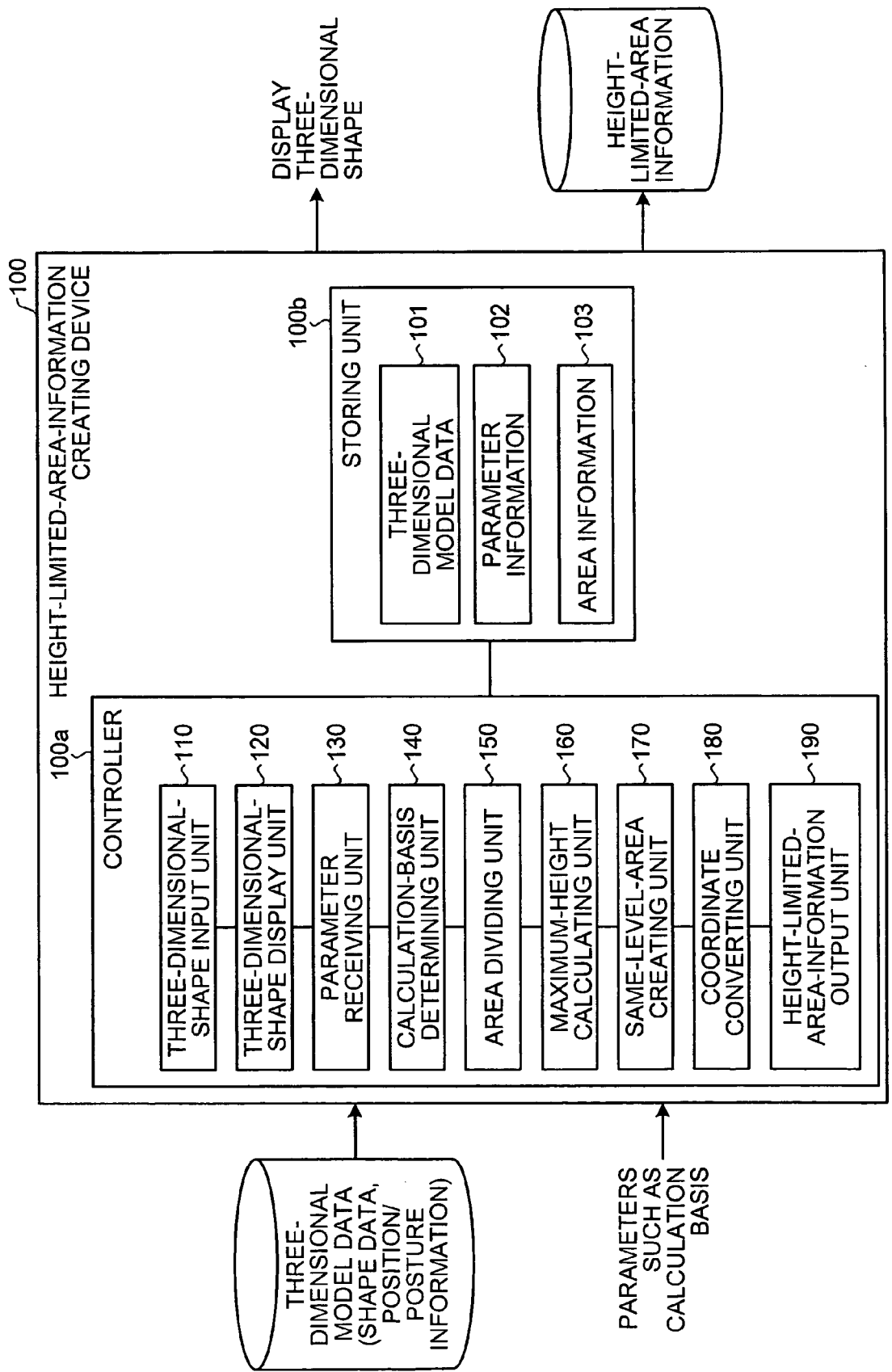

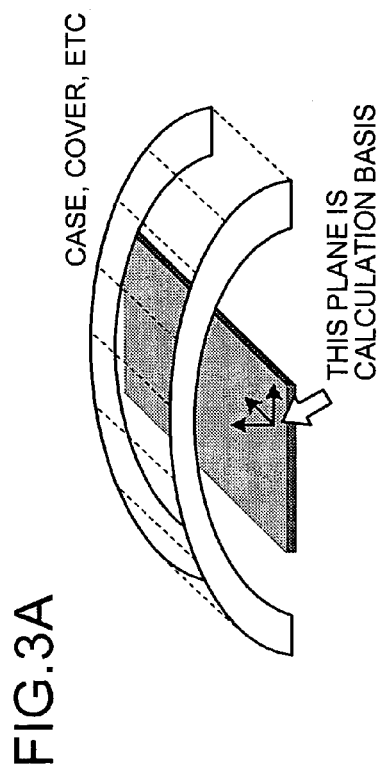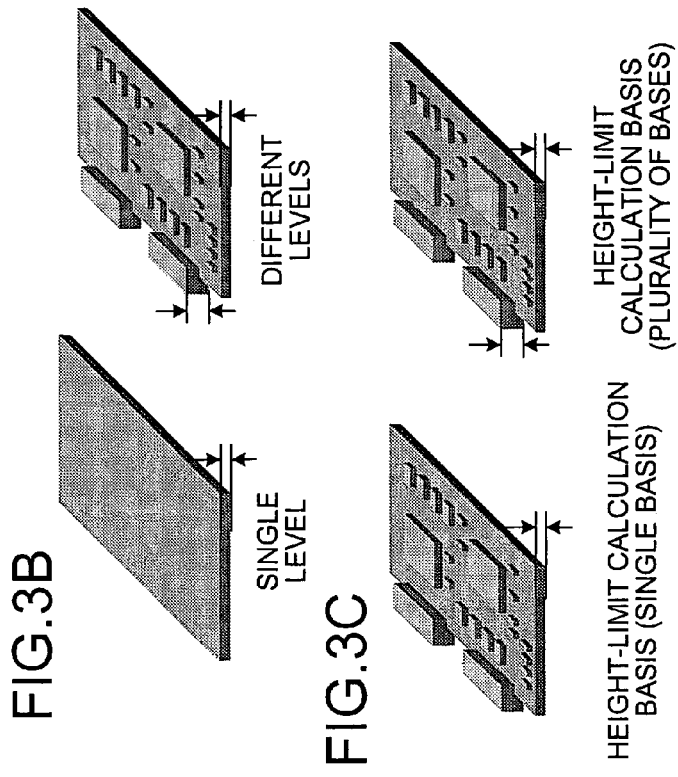

IMAGE OF CROSS SECTION AT CLIP PLANE WITH VERTICAL
DIRECTION DIRECTED TO BACK OF IMAGE A

DISPLAYED IMAGE

ONE BOX IS A DISPLAYED PIXEL (EACH PIXEL IS RECORDED WITH COLOR, DEPTH, AND NAME)

IMAGE DATA IN FRAME BUFFER

IN THIS EXAMPLE, BECAUSE SOLID POLYGON IS CLOSER THAN DOTTED POLYGON (TO PRINTED CIRCUIT BOARD), PIXELS OF SOLID POLYGON ARE INDICATED

DIVIDE PRINTED CIRCUIT BOARD

CONVERT VERTEXES OF GRID THAT DIVIDES PRINTED CIRCUIT BOARD FROM THREE-DIMENSIONAL COORDINATES INTO TWO-DIMENSIONAL COORDINATES ON SCREEN AND ACQUIRE POLYGON INFORMATION OF CORRESPONDING PIXELS.
CENTER OF GRID CAN BE USED INSTEAD OF FOUR VERTEXES.

FIG.6F
RESULT OF PROCESSING ALL GRIDS AND SRROUNDING EACH AREA OF SAME HEIGHT
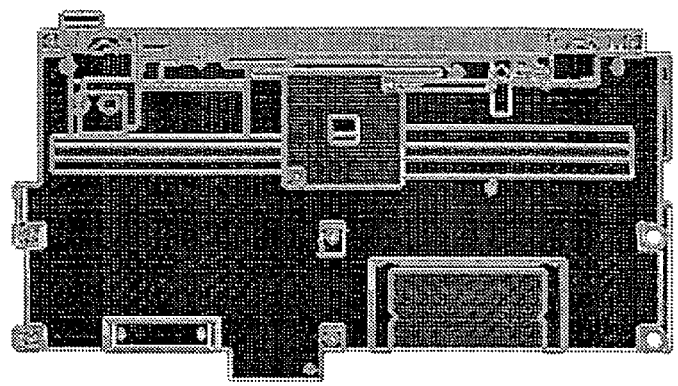
RESULT IN
LATERAL VIEW

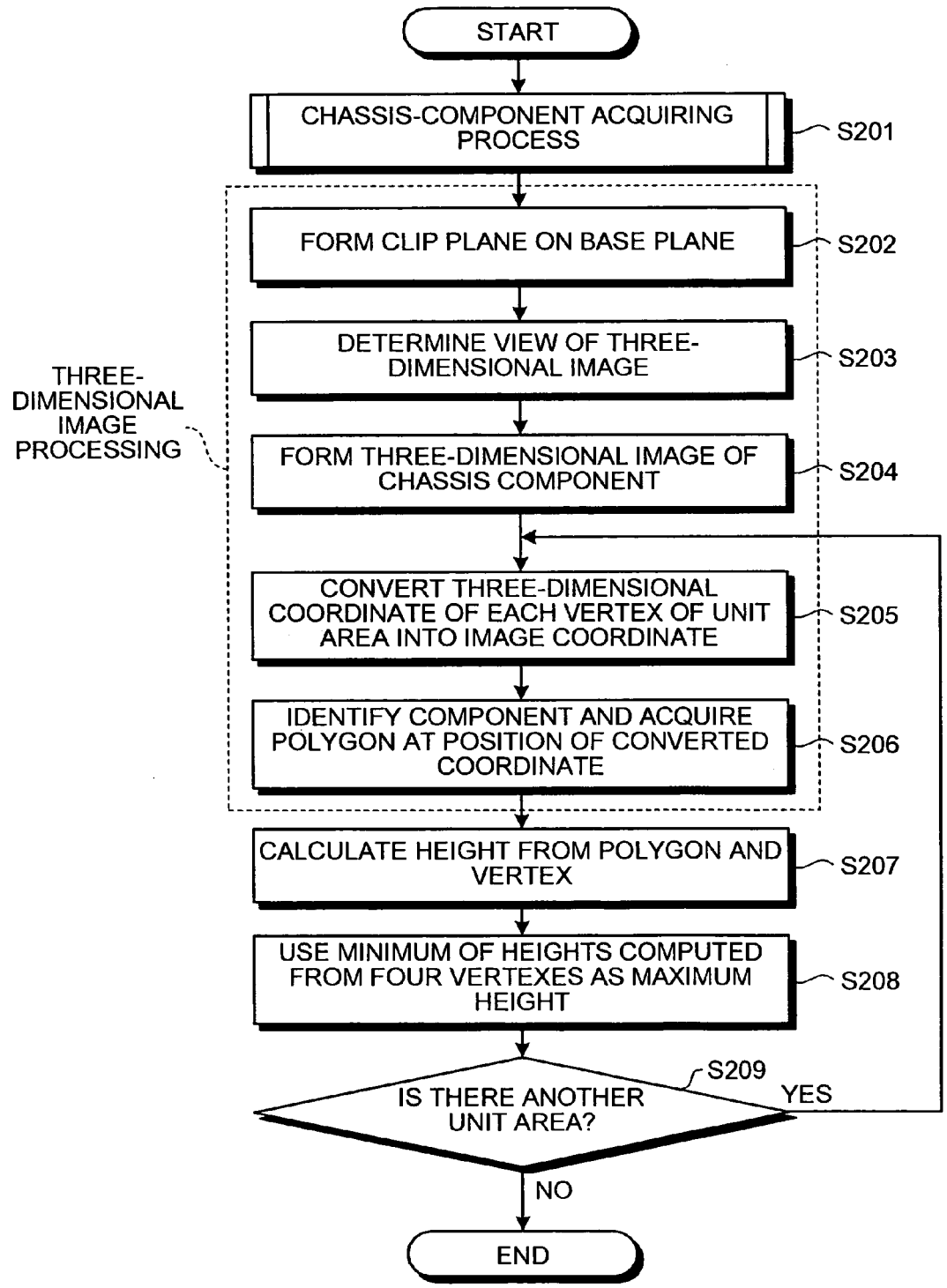

FIG.12

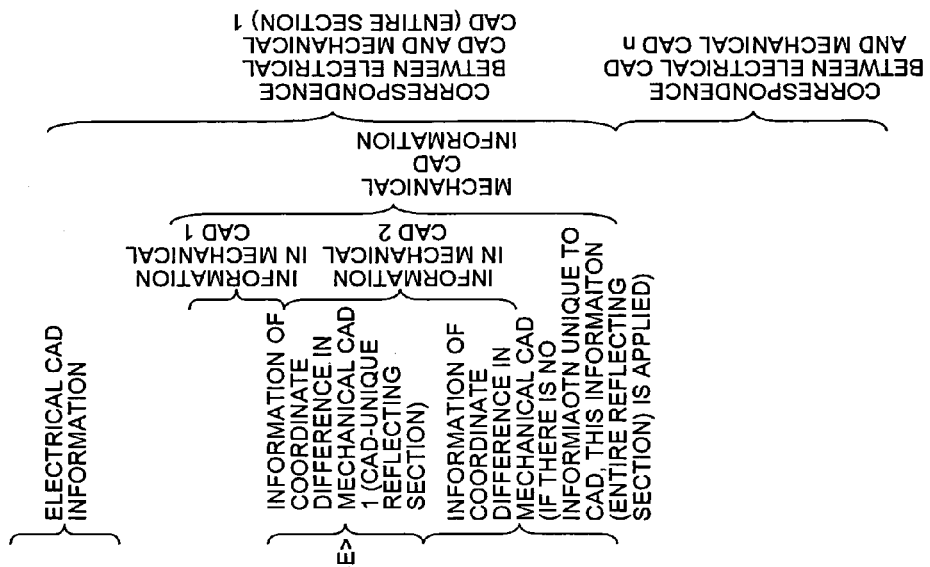

```
<REPLACEMENT-COMPONENT MANAGEMENT>
 <ELECTRICAL CAD>
  <COMPONENT IDENTIFIER>a12345-0001</COMPONENT IDENTIFIER>
  <SHAPE LIBRARY NAME>AA1234</SHAPE LIBRARY NAME>
 </ELECTRICAL CAD>
 <MECHANICAL CAD>
  <CAD1>
   <COMPONENT IDENTIFIER>AB12345-0001</COMPONENT IDENTIFIER>
  </CAD1>
  <CAD2>
   <COMPONENT IDENTIFIER>AB12345-0001</COMPONENT IDENTIFIER>
   <COORDINATE DIFFERENCE>
    <X COORDINATE DIFFERENCE>10.0</X COORDINATE DIFFERENCE>
    <Y COORDINATE DIFFERENCE>20.0</Y COORDINATE DIFFERENCE>
    <Z COORDINATE DIFFERENCE>-5.0</Z COORDINATE DIFFERENCE>
    <ROTATING COORDINATE DIFFERENCE>90.0 0.0 180.0</ROTATING COORDINATE DIFFERENCE>
   </COORDINATE DIFFERENCE>
  </CAD2>
  <COORDINATE DIFFERENCE>
   <X COORDINATE DIFFERENCE>0.0</X COORDINATE DIFFERENCE>
   <Y COORDINATE DIFFERENCE>0.0</Y COORDINATE DIFFERENCE>
   <Z COORDINATE DIFFERENCE>0.0</Z COORDINATE DIFFERENCE>
   <ROTATING COORDINATE DIFFERENCE>0.0 0.0 90.0</ROTATING COORDINATE DIFFERENCE>
  </COORDINATE DIFFERENCE>
 </MECHANICAL CAD>
</REPLACEMENT-COMPONENT MANAGEMENT>
<REPLACEMENT-COMPONENT MANAGEMENT>
 <ELECTRICAL CAD>
  <COMPONENT IDENTIFIER>a12345-0002</COMPONENT IDENTIFIER>
  <SHAPE LIBRARY NAME>AA1234</SHAPE LIBRARY NAME>
 </ELECTRICAL CAD>
 <MECHANICAL CAD>
  <CAD1>
   <COMPONENT IDENTIFIER>AB12345-0002</COMPONENT IDENTIFIER>
  </CAD1>
   :
</REPLACEMENT-COMPONENT MANAGEMENT>
```

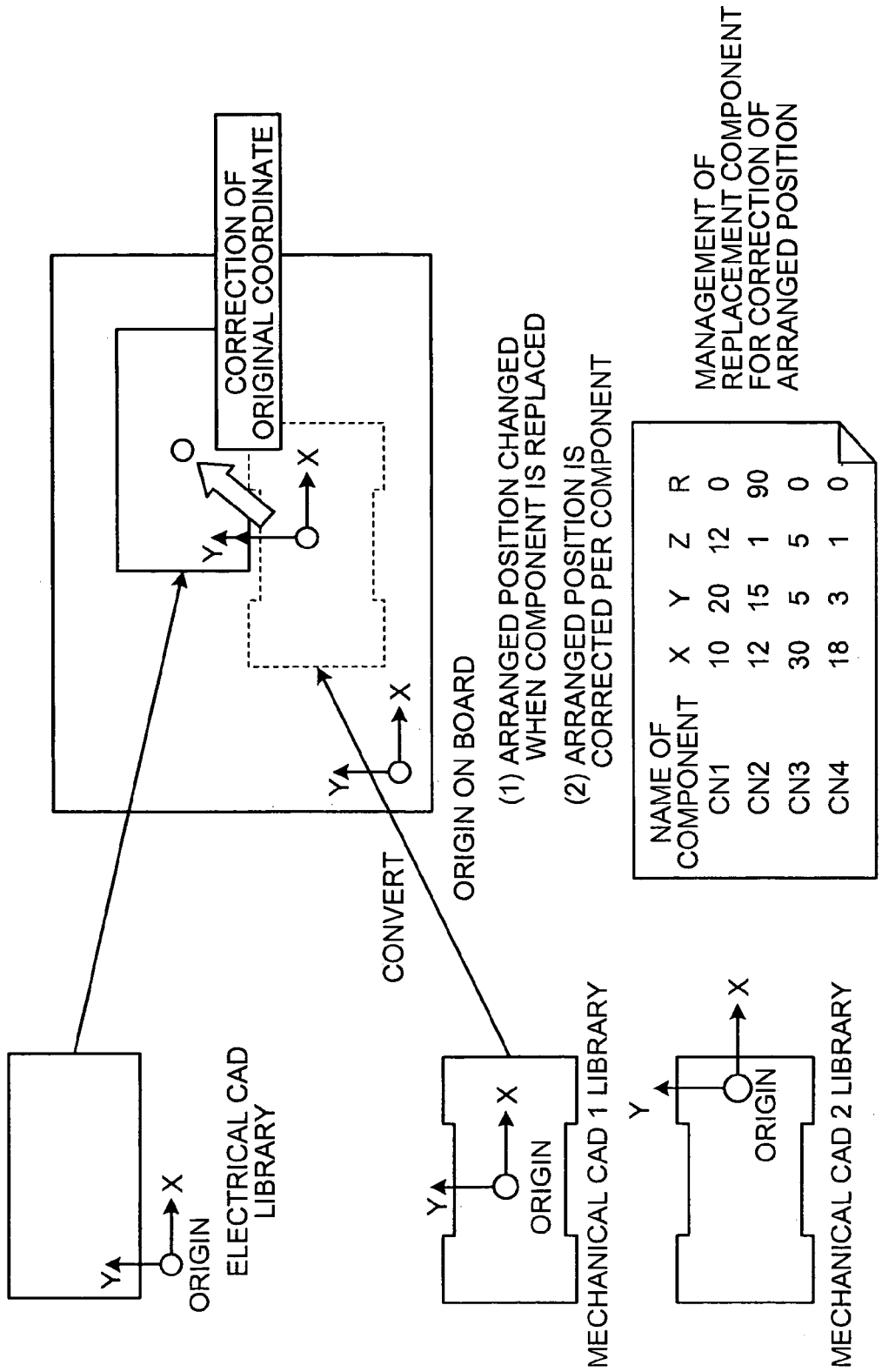

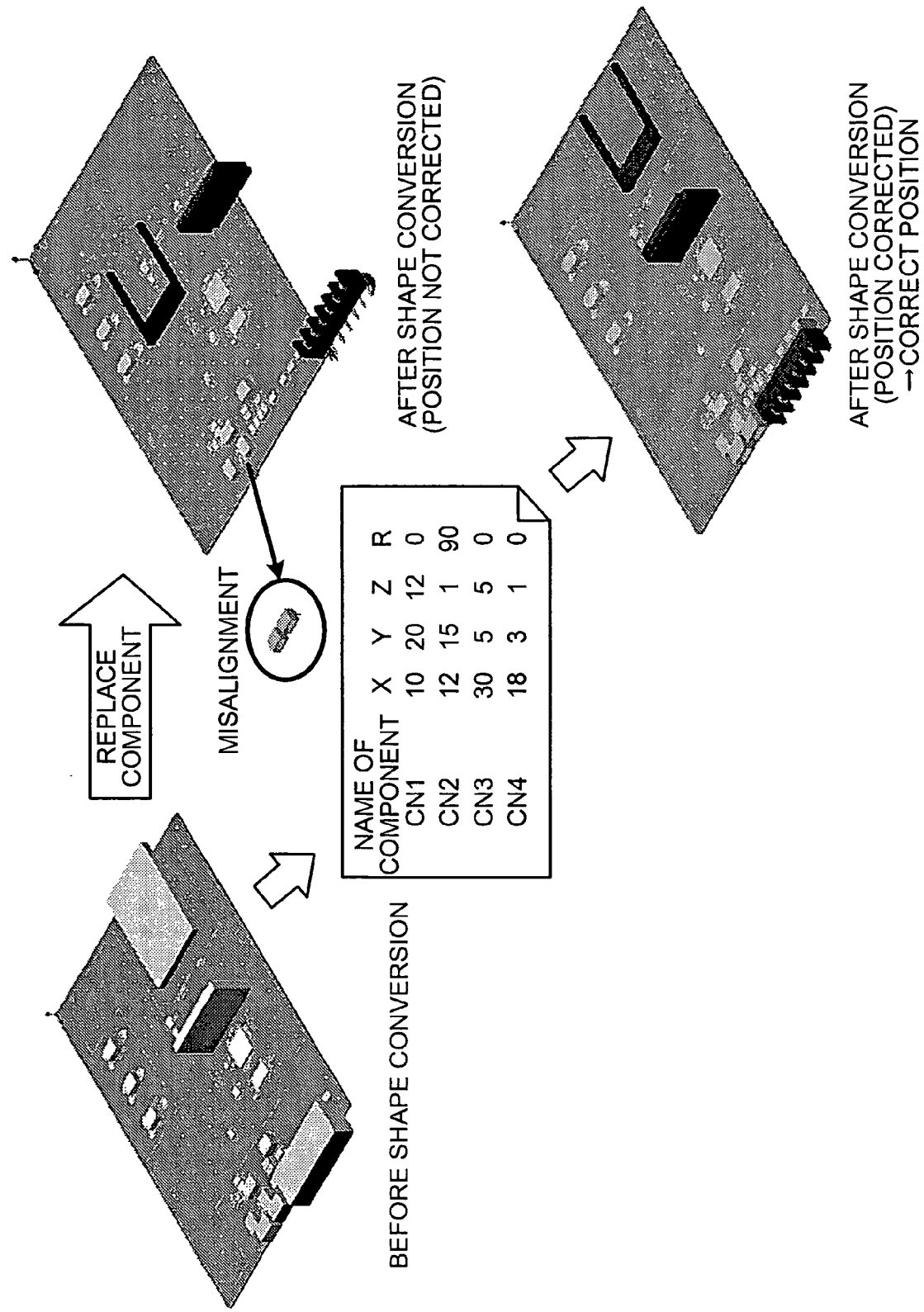

FIG.16
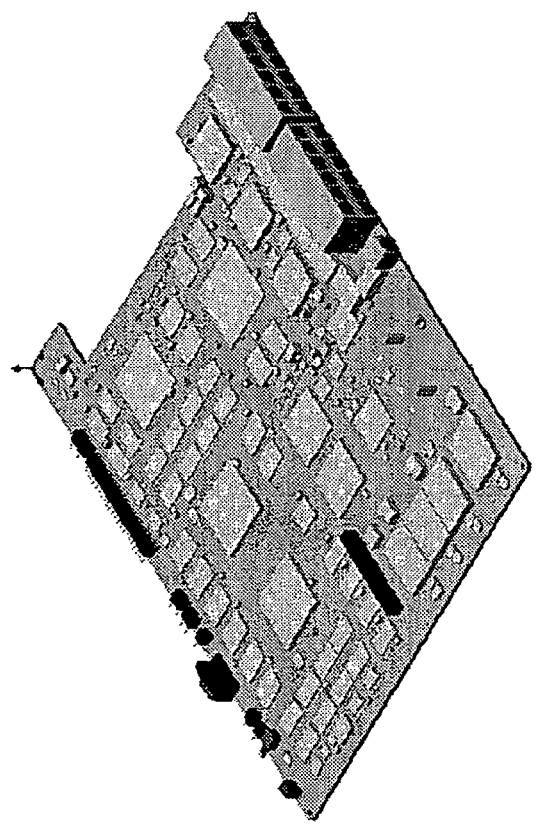
AFTER SHAPE CONVERSION
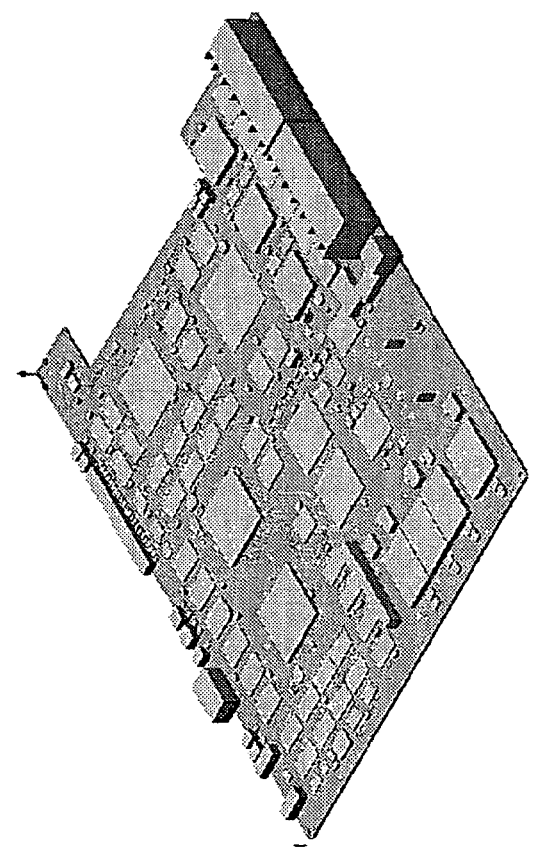
BEFORE SHAPE CONVERSION

SHAPE DETAILING DEVICE, SHAPE DETAILING METHOD, COMPUTER PROGRAM PRODUCT, MECHANICAL CAD MACHINE, AND METHOD OF MANUFACTURING THREE-DIMENSIONAL STRUCTURE

CROSS REFERENCE TO RELATED APPLICATION

This application claims the benefit under 35 U.S.C. Section 119, of Japanese Patent Application No. 2006-265887, filed Sep. 28, 2006, which is hereby incorporated by reference in its entirety into this application.

BACKGROUND OF THE INVENTION

1. Field of the Invention

The present invention relates to a technology for interaction between an electrical computer-aided design (CAD) system and a mechanical CAD system.

2. Description of the Related Art

To design an information processing device and the like, electrical design that uses the electrical CAD system and mechanical design that uses the mechanical CAD system has been performed in parallel. For example, the electrical design includes a circuit design on a printed circuit board, and the mechanical design includes a shape design of a chassis and a layout of components.

The electrical design and the mechanical design can be performed in parallel. However, a shape of the chassis often limits the shape and layout of electrical components, which repeatedly requires mutual exchange of information on the electrical design and that on the mechanical design according to the progress of the design work. Therefore, an electrical CAD-mechanical CAD interaction supporting system has been developed to support information exchange which is required between the electrical design and the mechanical design. For example, Japanese Patent Laid-open No. H11-353341 describes a three-dimensional-model producing device that supports an interference check in the mechanical CAD system and the like by converting component shape information in electrical-system design information into three-dimensional component shape information.

However, because the three-dimensional component shape information used in the three-dimensional-model producing device is rather 2.5-dimensional component shape information including a two-dimensional shape added with height than three-dimensional information, there is a problem that a complicated shape of a component cannot be handled with high accuracy.

SUMMARY OF THE INVENTION

It is an object of the present invention to at least partially solve the problems in the conventional technology.

According to an aspect of the present invention, a shape detailing device includes a storage unit that stores therein association information including an identifier of each structure that forms a three-dimensional structure in a CAD system and an identifier of the structure in a mechanical CAD system associated with each other, and a converting unit that converts shape information of the structure created by the electrical CAD system into shape information for the mechanical CAD system based on the association information.

According to another aspect of the present invention, a CAD machine includes a storage unit that stores therein association information including an identifier of each structure that forms a three-dimensional structure in an electrical CAD system and an identifier of the structure in a mechanical CAD system associated with each other, a converting unit that converts shape information of the structure created by the electrical CAD system into shape information for the mechanical CAD system based on the association information, and a height-limited-area-information creating unit that creates height-limited-area information for a space formed when a plurality of structures are combined and laid out to form the three-dimensional structure, the shape information of at least one of the structures having been converted into the shape information for the mechanical CAD system.

According to still another aspect of the present invention, a shape detailing method includes storing association information including an identifier of each structure that forms a three-dimensional structure in a CAD system and an identifier of the structure in a mechanical CAD system associated with each other, and converting shape information of the structure created by the electrical CAD system into shape information for the mechanical CAD system based on the association information.

According to still another aspect of the present invention, a method of manufacturing a three-dimensional structure design of which is supported by a CAD-interaction supporting system that supports an interaction between an electrical CAD system and a mechanical CAD system, includes storing association information including an identifier of each structure that forms a three-dimensional structure in the electrical CAD system and an identifier of the structure in the mechanical CAD system associated with each other, and converting shape information of the structure created by the electrical CAD system into shape information for the mechanical CAD system based on the association information.

According to still another aspect of the present invention, a computer-readable recording medium stores therein a computer program that causes a computer to implement the above method.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 1 is a schematic of a mechanical CAD-electrical CAD interaction supporting system according to an embodiment of the present invention;

FIG. 2 is a block diagram of a height-limited-area-information creating device shown in FIG. 1;

FIG. 3A is a schematic of a printed circuit board and a chassis for which height-limited-area information is created;

FIG. 3B is examples of the printed circuit board;

FIG. 3C is examples of the printed circuit board that includes components mounted thereon;

FIG. 3D is a schematic of the printed circuit board divided into unit areas;

FIG. 3E is a schematic of the printed circuit board and a cover shown in FIG. 3A;

FIG. 3F is an example of a result of calculating the height-limited-area information;

FIG. 6F is an example of same-level areas created by a same-level-area creating unit shown in FIG. 2;

FIG. 7 is a flowchart of a process of calculating the maximum height performed by the maximum-height calculating unit;

FIG. 12 is an example of replacement-component information managed by a replacement-component-information managing unit shown in FIG. 11;

FIG. 13 is a schematic for explaining correction of a coordinate performed by a coordinate correcting unit shown in FIG. 11;

FIG. 14 is examples of the printed circuit board with the coordinate corrected and not corrected;

FIG. 16 is an example of the shape detailed by the shape detailing device;

DETAILED DESCRIPTION OF THE PREFERRED EMBODIMENTS

Figure 4:
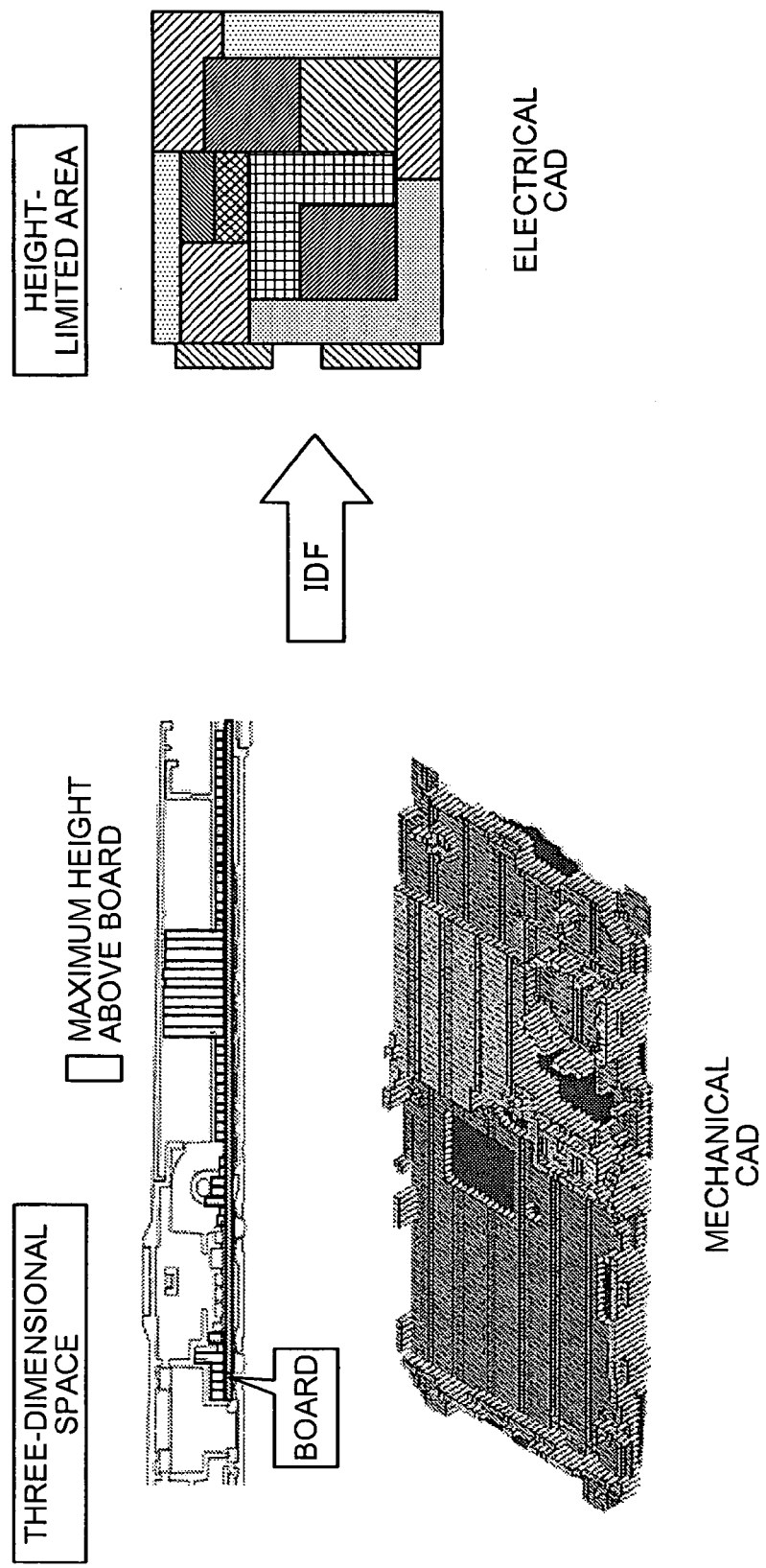
FIG. 4 is an example of the height-limited-area information being output based on calculation of a height limit.

Exemplary embodiments of the present invention are explained below in detail referring to the accompanying drawings. The present invention is not limited to the embodiments explained below. File formats such as integrated data file (IDF) and extended markup language (XML) described in the embodiments is merely an example, and other file formats can be used. While a polygon is a group of triangles according to the embodiments, other polygonal shapes can be used.

FIG. 1 is a schematic of a system configuration of a mechanical CAD-electrical CAD interaction supporting system according to an embodiment of the present invention. The mechanical CAD-electrical CAD interaction supporting system includes a mechanical CAD machine 10, an electrical CAD machine 20, a board-information creating device 30, a height-limited-area-information creating device 100, and a shape detailing device 200.

The mechanical CAD machine 10 supports mechanical designing by managing three-dimensional model data of a chassis and components of an information processing device or the like, and the electrical CAD machine 20 supports electrical designing by managing information of a printed circuit board and electrical components. The board-information creating device 30 creates information of outer shape of the printed circuit board and component arrangement thereon based on the three-dimensional model data managed by the mechanical CAD machine 10 and outputs the information in an integrated data file (IDF) format. The IDF format is used to exchange information of the mechanical CAD system with that of the electrical CAD system.

The height-limited-area-information creating device 100 creates information related to a height limit of an empty space formed between the printed circuit board and the chassis or another printed circuit board using the three-dimensional model data managed by the mechanical CAD machine 10.

The shape detailing device 200 details shape information (2.5 dimensions) of an electrical component managed by the electrical CAD machine 20 and converts it into three-dimensional shape information. An MLIB used by the shape detailing device 200 is a file that defines relation between a component in an electric CAD system and the component in a mechanical CAD system to convert the shape information of the electrical component into three-dimensional shape information.

By the shape detailing device 200 detailing the shape information of the electrical component, the mechanical CAD machine 10 manages more precise three-dimensional models, and the board-information creating device 30 and the height-limited-area-information creating device 100 create more accurate information. While the IDF is used herein to exchange the information of the mechanical CAD system with that of the electrical CAD system, other file formats can be used. Detail of the height-limited-area-information creating device 100 and the shape detailing device 200 is explained below.

FIG. 2 is a block diagram of the height-limited-area-information creating device 100. The height-limited-area-information creating device 100 includes a controller 100a that performs a process required to create the height-limited-area information and a storing unit 100b that stores therein information required to create the height-limited-area information.

The controller 100a includes a three-dimensional-shape input unit 110, a three-dimensional-shape display unit 120, a parameter receiving unit 130, a calculation-basis determining unit 140, an area dividing unit 150, a maximum-height calculating unit 160, a same level-area creating unit 170, a coordinate converting unit 180, and a height-limited-area-information output unit 190.

The three-dimensional-shape input unit 110 reads the three-dimensional model data of a device that includes the printed circuit board and writes the data to the storing unit 100b as three-dimensional model data 101. The three-dimensional model data 101 includes information such as a three-dimensional shape, a position and posture, a name, and an attribute of the chassis and the components. The three-dimensional shape is represented by a group of triangles referred to as a polygon.

The three-dimensional-shape display unit 120 displays the three-dimensional shape on a display unit using the three-dimensional model data 101 in the storing unit 100b.

The parameter receiving unit 130 receives parameters such as a plane of the printed circuit board based on which the height limit is calculated, a size of an area to be a unit of calculation of the height limit, and a tolerance for determining the same height as specified by a user, and writes the parameters to the storing unit 100b as parameter information 102.

The calculation-basis determining unit 140 determines whether the printed circuit board includes different levels, and, if it has different levels, determines whether the height limit is to be calculated based on a plurality of levels or a single level. If the height limit is to be calculated based on a single level, the calculation-basis determining unit 140 removes the components mounted on the printed circuit board. In other words, the calculation-basis determining unit 140 removes the mounted components when the printed board includes different levels, like when the components mounted on the printed circuit board are integrated into the printed circuit board defined as a part of the three-dimensional shape of the printed circuit board, and also when the printed circuit board without the components mounted thereon is used as the base plane.

By the calculation-basis determining unit 140 removing the components mounted on the printed circuit board when the printed board includes different levels and one of the levels is used as the base plane for calculating the height limit, the height-limited-area-information creating device 100 calculates the height limit from the plane of the printed circuit board without the components using the printed circuit board including the components mounted thereon. Before calculating the height limit, the user determines whether to use the printed circuit board including the components mounted thereon or the printed circuit board without the components.

The area dividing unit 150 equally divides the printed circuit board for which the height limit is calculated, and writes such information as coordinates of resulting unit areas to the storing unit 100b as area information 103. The area dividing unit 150 divides a whole area of the printed circuit board into a size specified by the parameter as the size of the area used as the unit of calculating the height limit. The unit area for calculating the height limit is a rectangle, and the size of the unit area is specified by the length and the width of the rectangle.

When the level of the printed circuit board based on which the height limit is calculated varies from point to point, i.e., when the height limit is calculated based on the printed circuit board that includes the components mounted thereon, the area dividing unit 150 equally divides the area with respect to each area of the same level. While the whole area of the printed circuit board for which the height limit is calculated is equally divided herein, the whole area does not need to be divided equally.

The maximum-height calculating unit 160 calculates a maximum height of the empty space with respect to each unit area, and adds the calculated value to the area information 103. The maximum-height calculating unit 160 calculates the heights of the empty space from four points of the rectangle, and uses the least value of the four as the maximum height of the unit area. While the heights of the empty space from four points of the rectangle are calculated to acquire the maximum height of the unit area herein, other methods can be used to acquire the maximum height of the unit area. For example, the height of the empty space from the center of the rectangle can be calculated and used as the maximum height of the unit area.

The same-level-area creating unit 170 creates a same-level area using the maximum height, and adds information of the same-level area to the area information 103. The same-level-area creating unit 170 regards the levels within a tolerance received by the parameter receiving unit 130 as the same level to create the same-level area.

The coordinate converting unit 180 converts a coordinate system of the mechanical CAD machine 10 into that of the electrical CAD machine 20 in the storing unit 100b. The coordinate converting unit 180 converts the coordinate system when the user specifies the coordinate system of the electrical CAD machine 20.

The height-limited-area-information output unit 190 creates the height-limited-area information based on the area information 103 converted by the coordinate converting unit 180, and outputs the area information 103 in the IDF format.

FIGS. 3A to 3F are schematics of a process performed by the height-limited-area-information creating device 100. The explanation is given below assuming that the height-limited-area-information creating device 100 calculates the height limited by a case or a cover having a free-form inner surface, as shown in FIG. 3A.

FIG. 3B is a comparison of the printed circuit board including a single level and the printed circuit board including different heights from point to point. FIG. 3C is a comparison of a single level and a plurality of levels as the base plane for calculating the height limit.

FIG. 3D is a schematic of the printed circuit board equally divided by the height-limited-area-information creating device 100, and FIG. 3E is a schematic of how the height limit is calculated with respect to each unit area. In this manner, by dividing the printed circuit board into equal areas and calculating the height limit with respect to each unit area, calculation of the height limit is stable even for a case or a cover that includes the free-form surface.

FIG. 3F is a schematic of the result of calculating the height limit. FIG. 4 is an example of the height-limited-area information being output based on calculation of the height limit. The height-limited-area information is output in the IDF format so that the electrical CAD machine 20 can read it.

Figure 5:
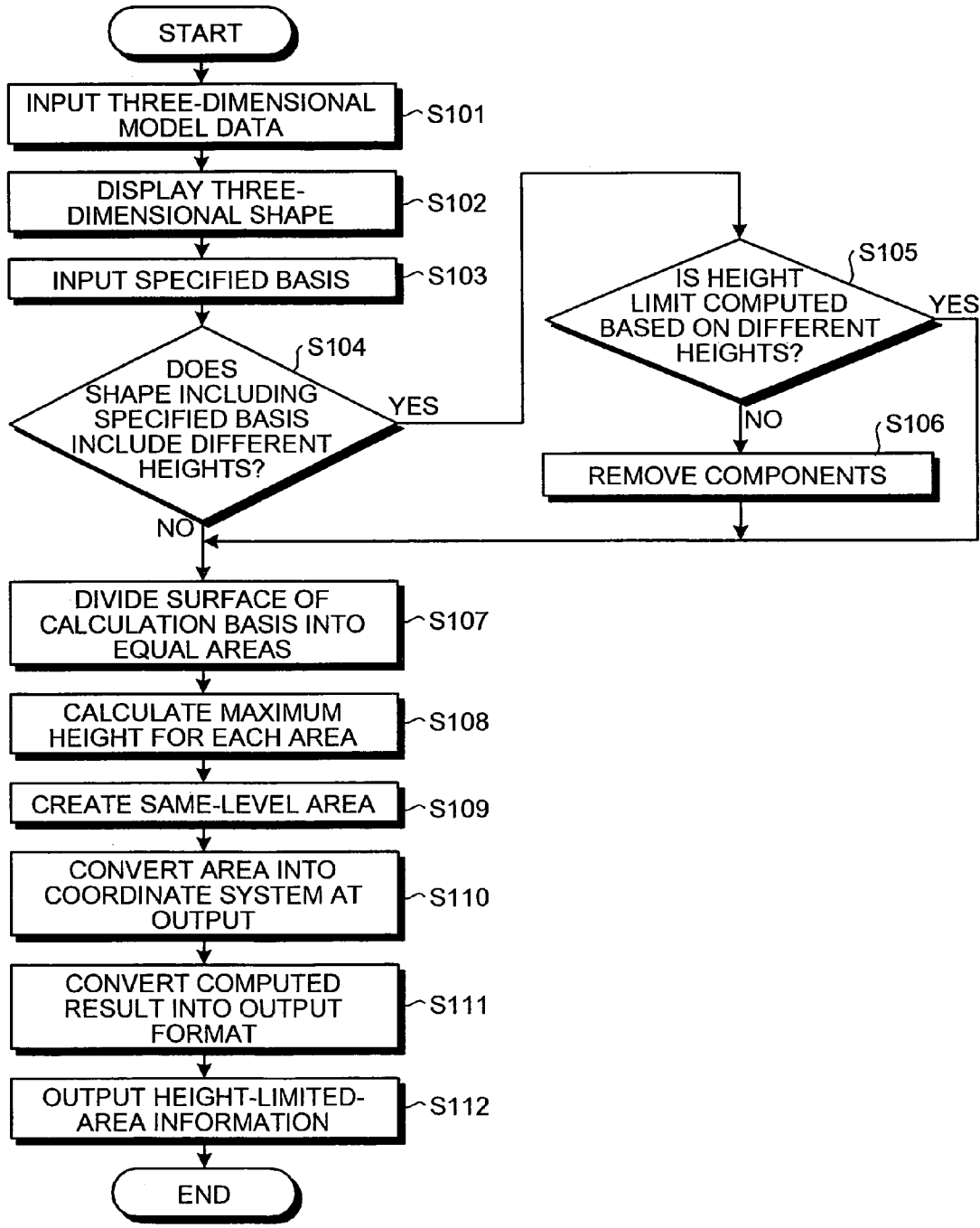
FIG. 5 is a flowchart of the process performed by the height-limited-area-information creating device.

FIG. 5 is a flowchart of the process performed by the height-limited-area-information creating device 100. In the height-limited-area-information creating device 100, the three-dimensional-shape input unit 110 inputs the three-dimensional model data (step S101), and writes it to the storing unit 100b as the three-dimensional model data 101.

The three-dimensional-shape display unit 120 reads the three-dimensional model data 101 and displays the three-dimensional shape (step S102). The parameter receiving unit 130 receives parameters such as the specified basis (the level of the printed circuit board) based on which the height limit is calculated as specified by the user (step S103), and stores the parameters in the storing unit 100b as the parameter information 102.

The calculation-basis determining unit 140 determines whether the specified basis includes different levels (step S104), and, if it has different levels, determines whether the height limit is to be calculated based on a plurality of levels based on setup information (step S105). If the height limit is to be calculated based on a single level, the calculation-basis determining unit 140 removes the components mounted on the specified base plane (step S106).

The area dividing unit 150 equally divides the base plane for which the height limit is calculated (step S107), and the maximum-height calculating unit 160 calculates the maximum height for each of the equal areas (step S108). The same-level-area creating unit 170 creates a same-level area using the tolerance in the parameter information 102 (step S109), and the coordinate converting unit 180 converts the area information 103 into the coordinate system used for the output (step S110). The height-limited-area-information output unit 190 converts the calculated result of the height limit into the IDF format, which is the output format (step S111), and outputs it as the height-limited-area information (step S112).

In this manner, the calculation-basis determining unit 140 determines whether the specified basis includes different levels. If it has different levels, the calculation-basis determining unit 140 determines whether the height limit is to be calculated based on a plurality of levels based on setup information. As a result, the height limit for the printed circuit board including components mounted thereon and the height limit for the printed circuit board without components can be selected if the printed circuit board used includes the components mounted thereon.

Figure 6A:
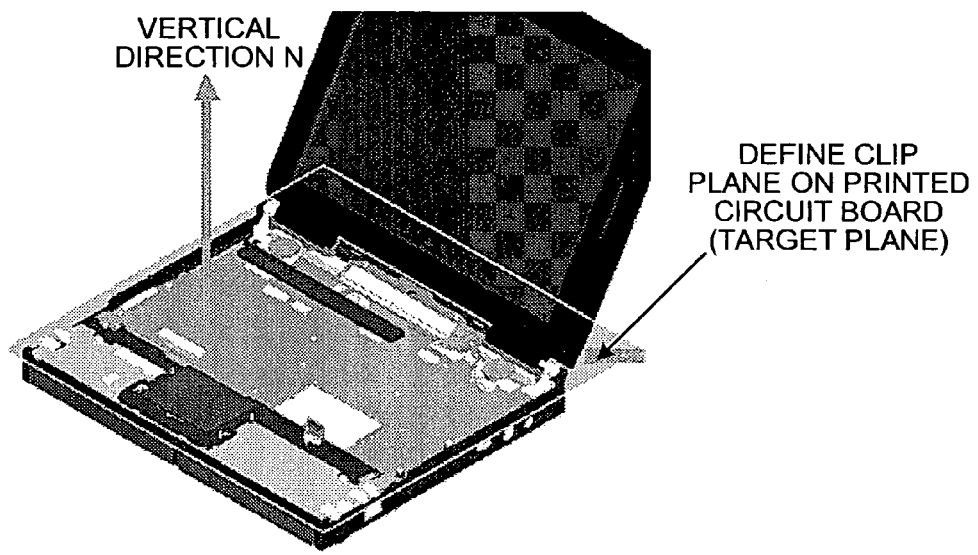
FIG. 6A is a schematic of the printed circuit board.

In the process of calculating the maximum height, as shown in FIG. 6A, the maximum-height calculating unit 160 defines a clip plane used to process a three-dimensional image on the base plane based on which the maximum height is calculated.

Figure 6B:
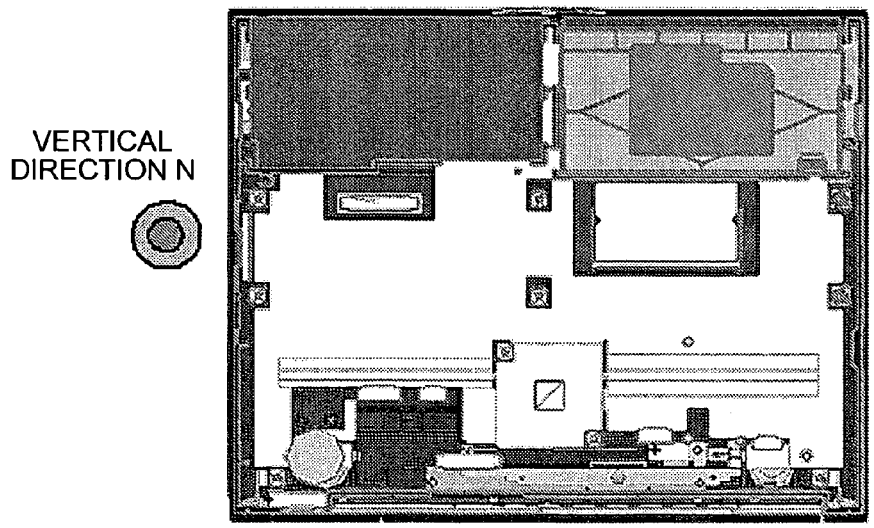
FIG. 6B is a cross-sectional view of the printed circuit board sectioned at a clip plane shown in FIG. 6A.
Figure 6C:
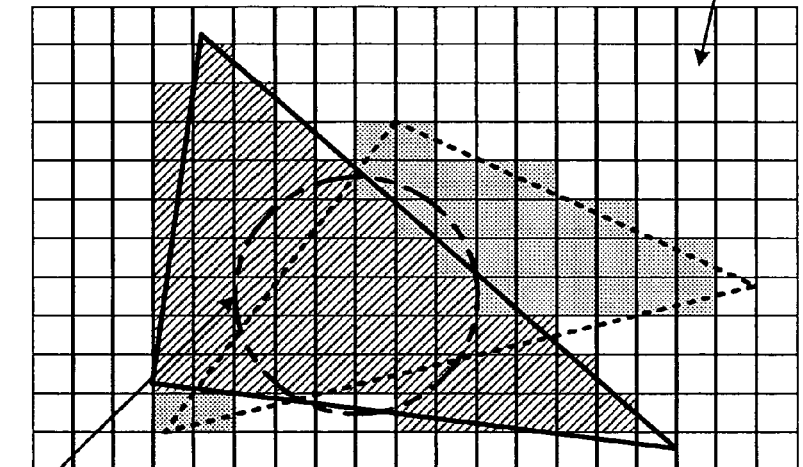
FIG. 6C is an example of image data created by a maximum-height calculating unit shown in FIG. 2.

As shown in FIG. 6B, an image of a cross section at the clip plane with a vertical direction N of the clip plane directed to the back of the image A is formed using a three-dimensional image processing. The image A is formed in a frame buffer.

As shown in FIG. 6B, the image A indicates pixels of a polygon drawn with a solid line closer to the printed circuit board to be the base plane.

Figure 6D:
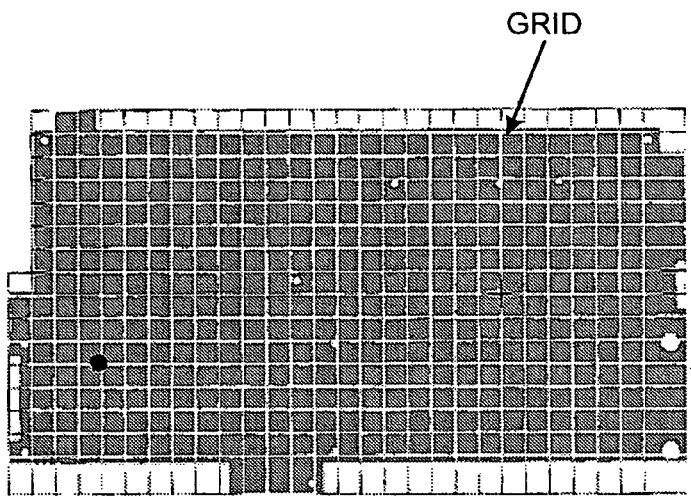
FIG. 6D is a schematic of the printed circuit board divided into unit areas.
Figure 6E:
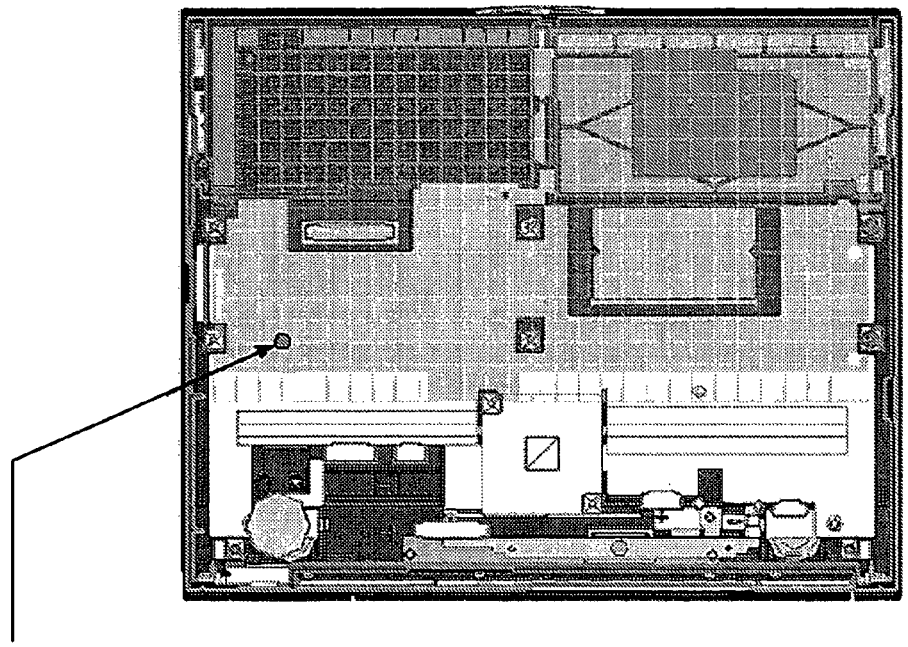
FIG. 6E is an example of an image of the printed circuit board including height information.

Vertexes of each unit area that divides the printed circuit board (a grid shown in FIG. 6D) are converted from three-dimensional coordinates into two-dimensional coordinates on the image A, polygon information of corresponding pixels is acquired, and a distance from each vertex to the polygon is calculated as a height of the vertex (FIG. 6E). The height is calculated for four vertexes of the grid, and the least value of the four heights is used as the maximum height for the grid. Instead of calculating the heights for four vertexes, the height at the center of the grid can be calculated as the maximum height. Same-level areas based on the maximum height are shown in FIG. 6F.

FIG. 7 is a flowchart of a process of calculating the maximum height performed by the maximum-height calculating unit 160. The maximum-height calculating unit 160 acquires a chassis component for which the height from the printed circuit board is calculated (step S201).

The maximum-height calculating unit 160 forms the clip plane on the base plane of the printed circuit board based on which the height is calculated (step S202), and determines a view so that a normal line of the base plane corresponds to the depth (step S203). The maximum-height calculating unit 160 forms a three-dimensional image of the chassis component from the determined view (step S204).

The maximum-height calculating unit 160 selects one of the unit areas, converts the coordinate of each vertex of the selected unit area into an image coordinate (step S205). The maximum-height calculating unit 160 identifies the component and acquires the polygon at the position of the converted coordinate (step S206). The process at the steps S202 to S206 can be performed based on the three-dimensional image processing.

The maximum-height calculating unit 160 calculates the distance from each vertex to the polygon (step S207), uses the least value of the heights calculated for the four heights as the maximum height, and adds the maximum height to the area information 103 (step S208). The maximum-height calculating unit 160 determines whether there is another unit area (step S209). If there is another unit area, the process returns to the step S205, and if there is no more unit area, the process is terminated.

In this manner, the maximum-height calculating unit 160 acquires the polygon for which the height at each vertex of the unit area is limited using the three-dimensional image processing. As a result, the maximum height can be calculated faster than acquiring the polygon by determining whether an intersection of a vertical line from the vertex and the polygon is included in an area of the polygon.

Figure 8:
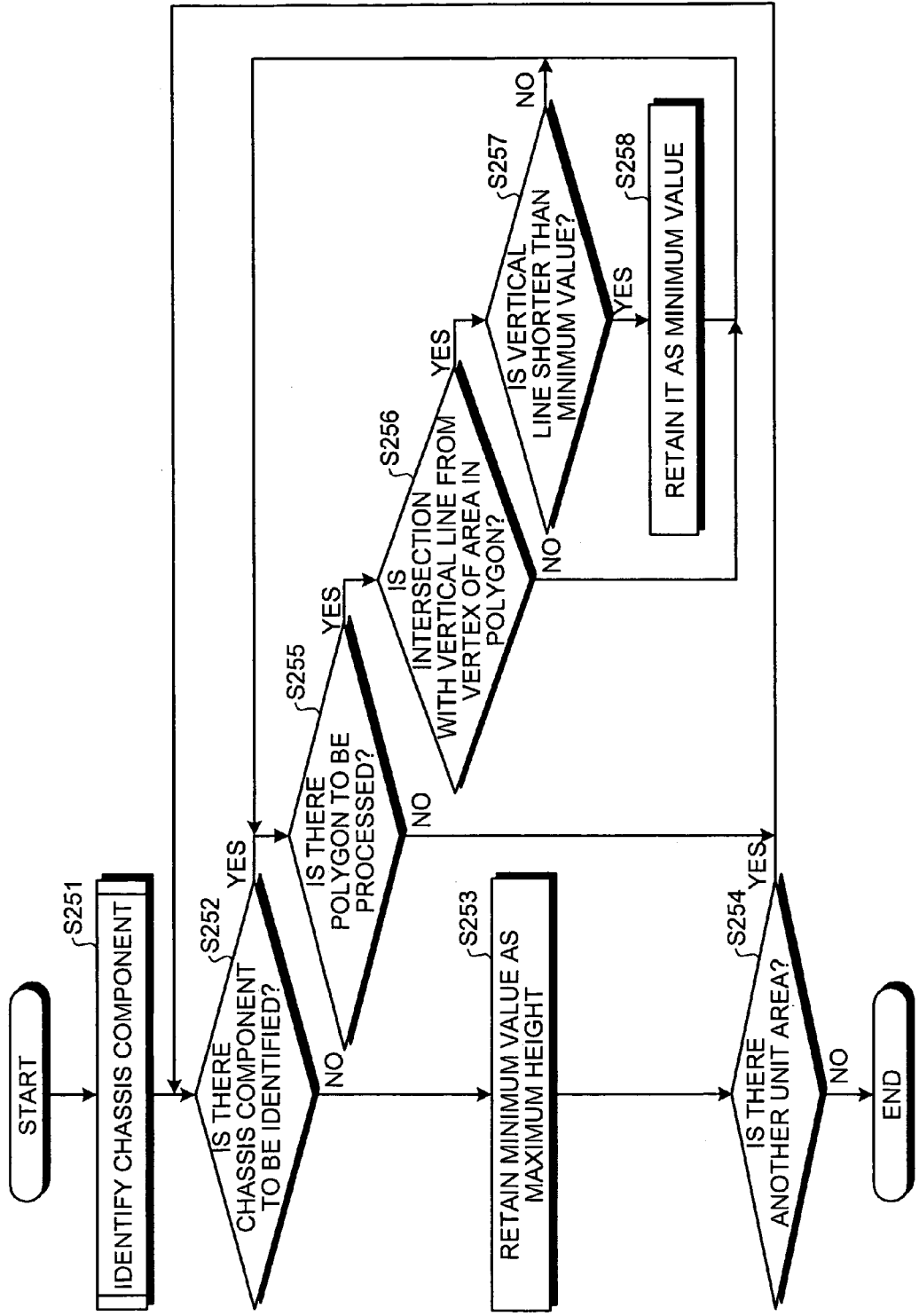
FIG. 8 is a flowchart of a process of calculating the maximum height based on an intersection of a vertical line from a vertex and a polygon.

For comparison, a flowchart of a process of calculating the maximum height when the polygon is acquired by determining whether the intersection of the vertical line from the vertex and the polygon is in the polygon is shown in FIG. 8. It is assumed that the maximum height is calculated for a single vertex with respect to each unit area.

In the maximum-height calculating process, the chassis component for which the height from the printed circuit board is calculated is identified (step S251). Whether there is a target chassis component is determined (step S252). If there are target chassis components, a single target chassis is selected, and whether there is a polygon indicative of the chassis component, i.e., a polygon to be processed, is determined (step S255).

If there are polygons, a single polygon is selected, and whether the intersection with the vertical line from the area vertex is in the polygon is determined (step S256). If the intersection is in the polygon, whether the vertical line is longer than a value retained as the minimum value is determined (step S257). As the minimum value, the most value of expected height limits is set as default. If the vertical line is shorter than the minimum value, the length of the vertical line is retained as the minimum value (step S258), and the process returns to the step S255. On the other hand, if the vertical line is not shorter than the minimum value, or if the intersection is not in the polygon, the process returns to the step S255 without updating the minimum value. If there is no polygon, the process returns to the step S252.

If there is no chassis component, it means that the maximum height has been calculated for the unit area. The minimum value is retained as the maximum height of the unit area (step S253), and whether there is another unit area is determined (step S254). If there is another unit area, the process returns to the step S252 and the calculation is performed for the next unit area. If there is no more unit area, the process is terminated.

In this manner, according to the maximum-height calculating process described above, all the polygons of all the chassis components need to be checked as to whether the intersection with the vertical line is included in the polygon, and therefore the calculation takes an extremely long time when the target device includes hundreds of thousands of polygons.

Figure 9:
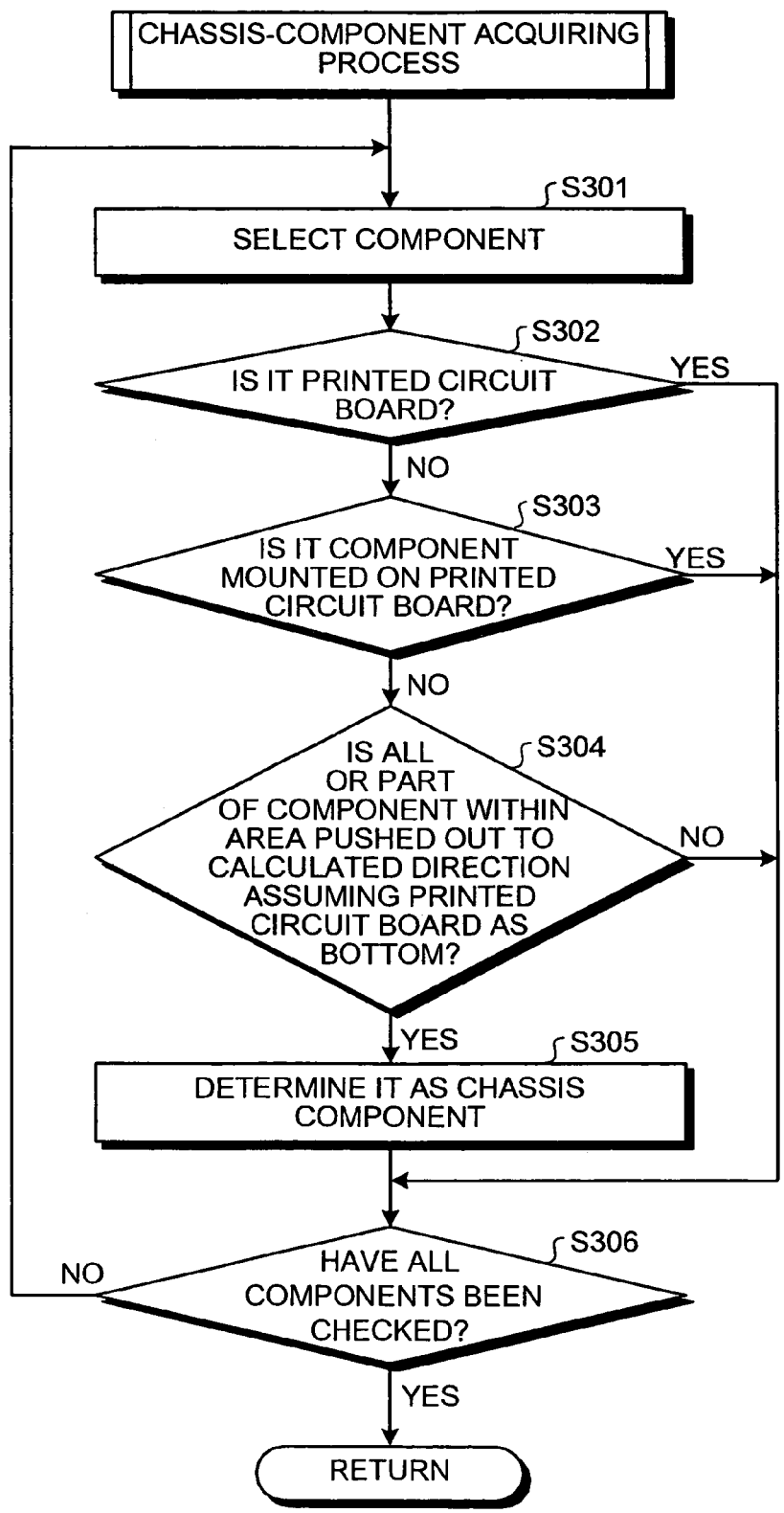
FIG. 9 is a flowchart of a chassis-component acquiring process.

FIG. 9 is a flowchart of the chassis-component acquiring process. In the chassis-component acquiring process, the maximum-height calculating unit 160 selects a component of which data is stored as the three-dimensional model data 101 (step S301), and determines whether the selected component is a printed circuit board (step S302).

If the selected component is a printed circuit board, the process moves to a step S306 because the printed circuit board is not a chassis component. If the selected component is not a printed circuit board, the maximum-height calculating unit 160 determines whether the selected component is a component mounted on the printed circuit board (step S303).

If the selected component is a component mounted on the printed circuit board, the process moves to the step S306 because the component is not a chassis component. If the selected component is not a component mounted on the printed circuit board, the maximum-height calculating unit 160 determines whether all or at least a part of the selected component is present within an area that includes the base plane of the printed circuit board as a bottom and extends in the direction in which the height limit is calculated as the height (step S304).

If the selected component is outside of the area, there is no need to calculate the height thereof, and the process moves to the step S306. If the selected component is within the area, the selected component is a chassis component (step S305). The maximum-height calculating unit 160 determines whether all the components have been checked (step S306). If there is any component that is not checked, the process returns to the step S301. If all the components have been checked, the process is terminated.

In this manner, the maximum-height calculating unit 160 acquires the chassis component and excluding other components, and thereby the maximum height can be efficiently calculated.

Figure 10:
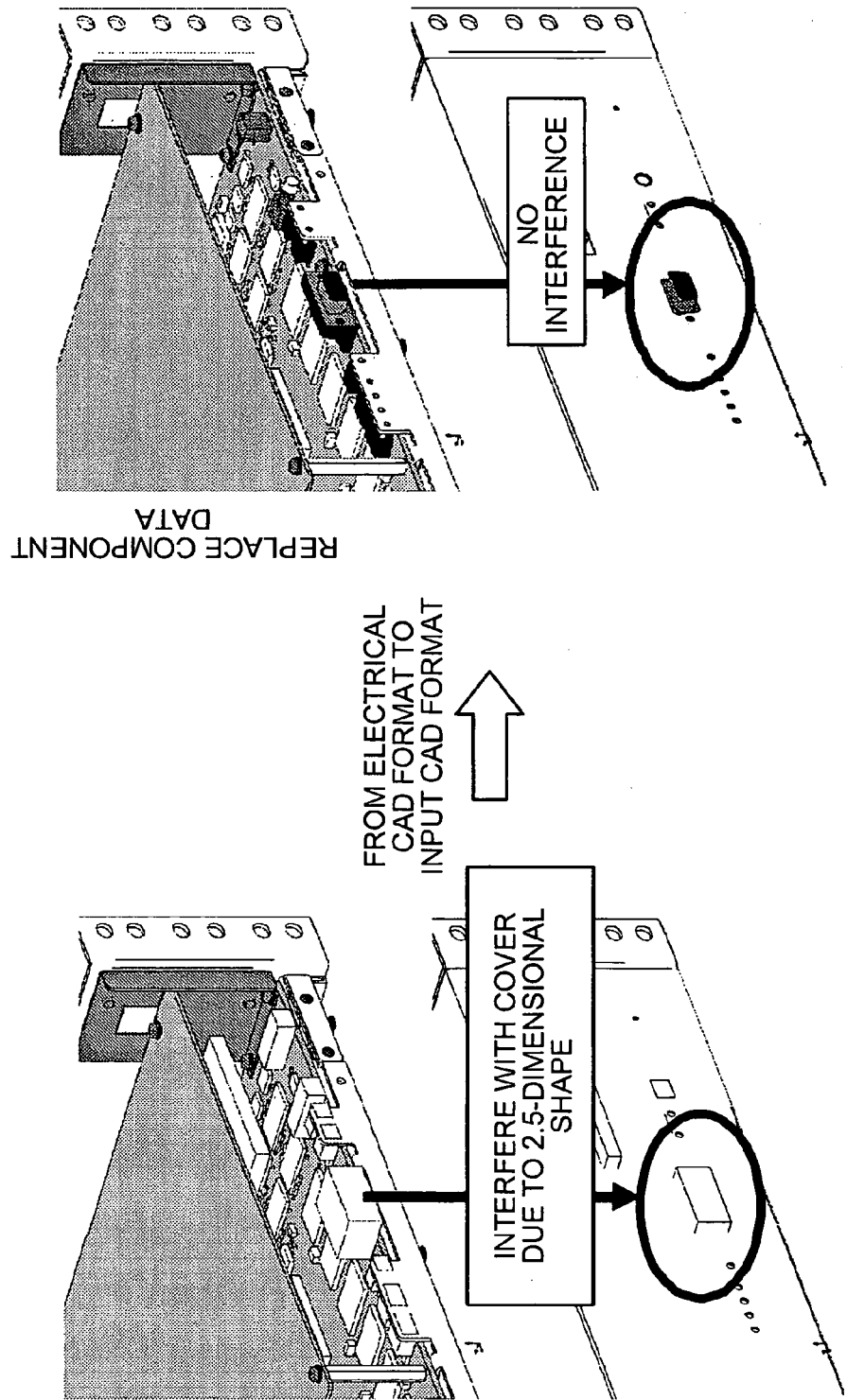
FIG. 10 is a schematic of a shape-detailing process performed by a shape detailing device shown in FIG. 1.

FIG. 10 is a schematic of a shape-detailing process performed by the shape detailing device 200. Because the shape of the component is 2.5-dimensional in the electrical CAD system, there is a risk that some components can interfere the cover that should not actually interfere when the mechanical CAD system uses the shape data from the electrical CAD system.

However, if the shape detailing device 200 converts the component data into three-dimensional data for use in the mechanical CAD system, interference between components can be precisely checked because the mechanical CAD system checks the interference using a precise shape.

Moreover, because the mechanical CAD system uses the precise shape data of the component, more precise shape data can be transferred to the height-limited-area-information creating device 100 when, for example, the printed circuit board includes an electrical component mounted thereon. As a result, the height-limited-area-information creating device 100 creates more precise height-limited-area information.

Figure 11:
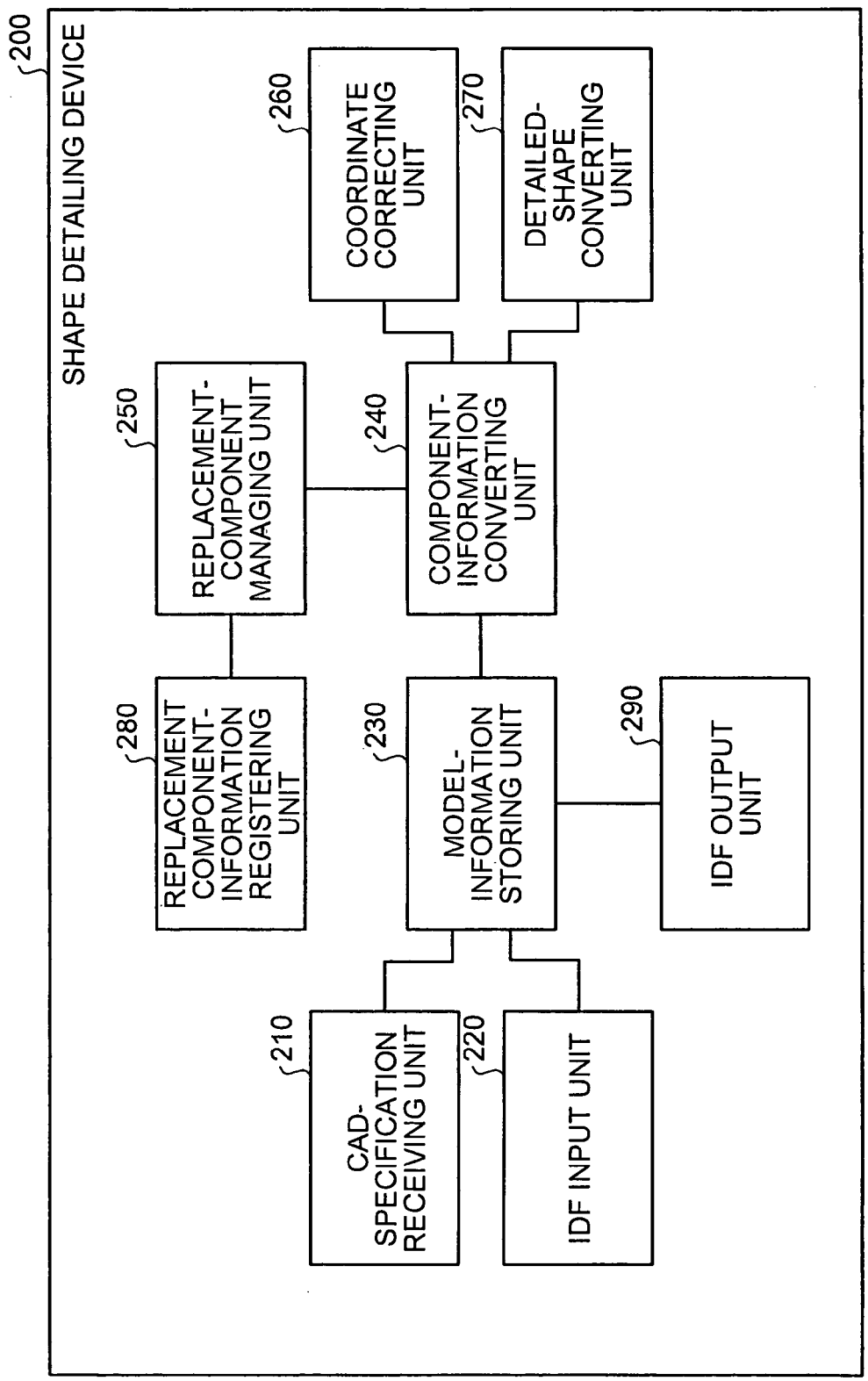
FIG. 11 is a function block diagram of the shape detailing device.

FIG. 11 is a function block diagram of the shape detailing device 200. The shape detailing device 200 includes a CAD-specification receiving unit 210, an IDF input unit 220, a model-information storing unit 230, a component-information converting unit 240, a replacement-component managing unit 250, a coordinate correcting unit 260, a detailed-shape converting unit 270, a replacement-component-information registering unit 280, and an IDF output unit 290.

The CAD-specification receiving unit 210 receives specification of the mechanical CAD system and the electrical CAD system to be interacted from the user. For example, the CAD-specification receiving unit 210 receives the name of the mechanical CAD system, the IDF file name created by the electrical CAD system, and the like.

The IDF input unit 220 reads the IDF of which the name is received by the CAD-specification receiving unit 210, and stores the model information created by the electrical CAD system in the model-information storing unit 230.

The model-information storing unit 230 stores therein the model information created by the electrical CAD system. Moreover, the model-information storing unit 230 stores therein the information received by the CAD-specification receiving unit 210.

The component-information converting unit 240 reads the model information created by the electrical CAD system from the model-information storing unit 230, converts the component information for the electrical CAD system into the component information for the mechanical CAD system using the replacement-component information, and writes the replacement-component information to the model-information storing unit 230. In other words, the component-information converting unit 240 converts the shape information and the coordinates of the component into a mechanical CAD format.

The component-information converting unit 240 converts the shape information and the coordinates in the component information from an electrical CAD format into the mechanical CAD format. As a result, the mechanical CAD machine 10 performs an interference check more accurately, and the height-limited-area-information creating device 100 creates more accurate height limit information.

The replacement-component managing unit 250 stores the component information in the electrical CAD format and the component information of the same component in the mechanical CAD format associated with each other. FIG. 12 is an example of the replacement-component information managed by the replacement-component managing unit 250. The replacement-component information is described in the XML format, and the correspondence between the information in the electrical CAD system and the information in the mechanical CAD system is defined as "<replacement-component management> . . . </replacement-component management>" with respect to each component.

Information in the electrical CAD system is defined as "<electrical CAD> . . . </electrical CAD>". In the information, a component number is defined as "<component identifier> . . . </component identifier>", and a component-shape type name is defined as "<shape library name> . . . </shape library name>".

Information in the mechanical CAD system is defined as "<mechanical CAD> . . . </mechanical CAD>", and coordinate difference is defined as "<coordinate difference> . . . </coordinate difference>". In the information, component information unique to each mechanical CAD system is defined in such a CAD-unique reflecting section as "<CAD1> . . . </CAD1>" or "<CAD2> . . . </CAD2>" with respect to each mechanical CAD system so that the information of a plurality of mechanical CAD systems can be included, and information common to the mechanical CAD systems is directly defined under "<mechanical CAD> . . . </mechanical CAD>". In the coordinate difference, the differences of an X coordinate, a Y coordinate, Z coordinate, and a rotating coordinate are defined as "<coordinate difference> . . . </coordinate difference>".

In the example shown in FIG. 12, a component of which the component number is A12345-0001 in the electrical CAD system corresponds to a component of which the component number is AB12345-0001 in the mechanical CAD system.

Returning to the explanation of FIG. 11, the coordinate correcting unit 260 corrects the coordinate of the component for the mechanical CAD system based on an instruction from the component-information converting unit 240. FIG. 13 is a schematic of correction of a coordinate performed by the coordinate correcting unit 260. In the libraries of the electrical CAD system and mechanical CAD systems, an origin of the coordinate can be set differently. As a result, if the component information in the electrical CAD system is simply converted into the component information in the mechanical CAD system, the position of the component can be incorrect.

In such a case, the coordinate correcting unit 260 corrects the coordinate using the coordinate difference managed by the replacement-component managing unit 250. In FIG. 13, for example, for a component CN1, an X coordinate-difference "10", Y coordinate difference "20", a Z coordinate difference "12", and a rotating coordinate difference "0" are managed by the replacement-component managing unit 250. As a result, the component is misaligned if the coordinate is not corrected due to the mechanical CAD machine 10; however, the component is displayed in the correct position by correcting the coordinate as shown in FIG. 14.

The detailed-shape converting unit 270 converts the shape information of the component into the mechanical CAD format based on the instruction from the component-information converting unit 240. In other words, the detailed-shape converting unit 270 converts the 2.5-dimensional information in the electrical CAD system into the three-dimensional detailed-shape information in the mechanical CAD system.

The replacement-component-information registering unit 280 registers the component information in the electrical CAD format and the component information of the same component in the mechanical CAD format associated with each other as specified by the user. The IDF output unit 290 reads the model information of which the component information is converted by the component-information converting unit 240 from the model-information storing unit 230 and outputs the model information in the IDF format.

Figure 15:
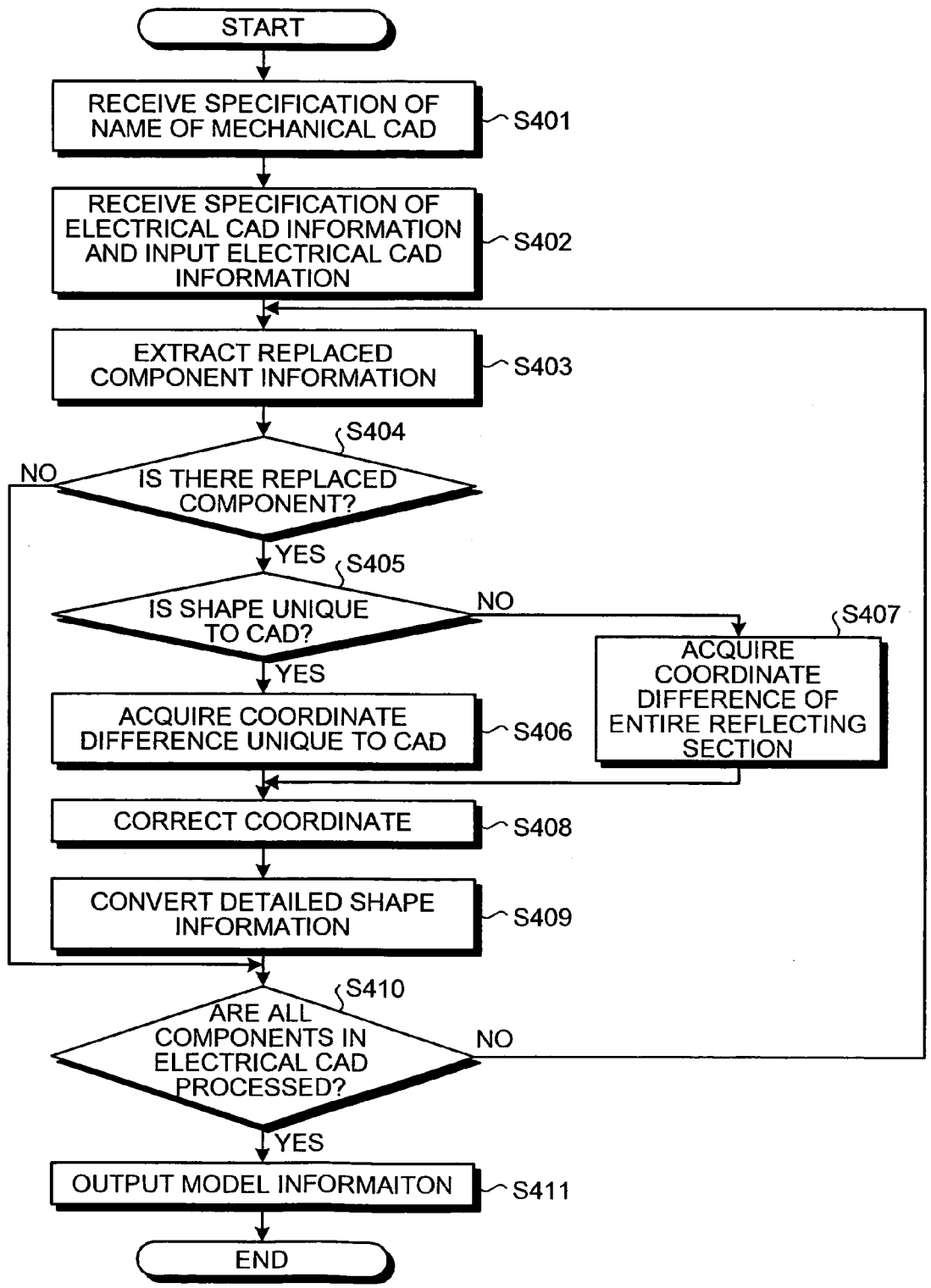
FIG. 15 is a flowchart of a process performed by the shape detailing device.

FIG. 15 is a flowchart of the process performed by the shape detailing device 200. In the shape detailing device 200, the CAD-specification receiving unit 210 receives the specification of the name of the mechanical CAD system for which the component information is converted and the specification of the electrical CAD system, and the IDF input unit 220 inputs the information of the electrical CAD system to store it in the model-information storing unit 230 (steps S401 and S402).

The component-information converting unit 240 reads component information piece by piece from the model-information storing unit 230, and requests the replacement-component managing unit 250 to extract the corresponding component information in the mechanical CAD system, i.e., the replacement-component information (step S403). If there is no component to be replaced (NO at step S404), the process moves to a step S410. If there is such a component (YES at step S404), whether the shape of the component is unique to the CAD system is determined (step S405). If the shape is unique to the CAD system, the coordinate difference unique to the CAD system is acquired (step S406). If the shape is not unique to the CAD system, the coordinate difference of an entire reflecting section is acquired (step S407).

The coordinate correcting unit 260 corrects the coordinate based on the coordinate difference (step S408), and the detailed-shape converting unit 270 converts the shape information in the electrical CAD system into that in the mechanical CAD system, i.e., the detailed shape information (step S409). The component-information converting unit 240 writes the component information of which the coordinate is corrected and of which the shape information is converted to the model-information storing unit 230, and determines whether all the components in the electrical CAD system have been processed (step S410). If there is any unprocessed component, the process returns to the step S403. If all the components have been processed, the IDF output unit 290 outputs the model information in which the component information has been converted in the IDF format (step S411).

In this manner, the component-information converting unit 240 converts the component information in the model-information storing unit 230 into the corresponding component information in the mechanical CAD system. As a result, the mechanical CAD machine 10 performs the interference check more accurately, and the height-limited-area-information creating device 100 creates more accurate height limit information.

FIG. 16 is an example of the shape detailed by the shape detailing device 200. The accuracy of the shape of the component mounted on the printed circuit board is different after the shape is converted.

Figure 17:
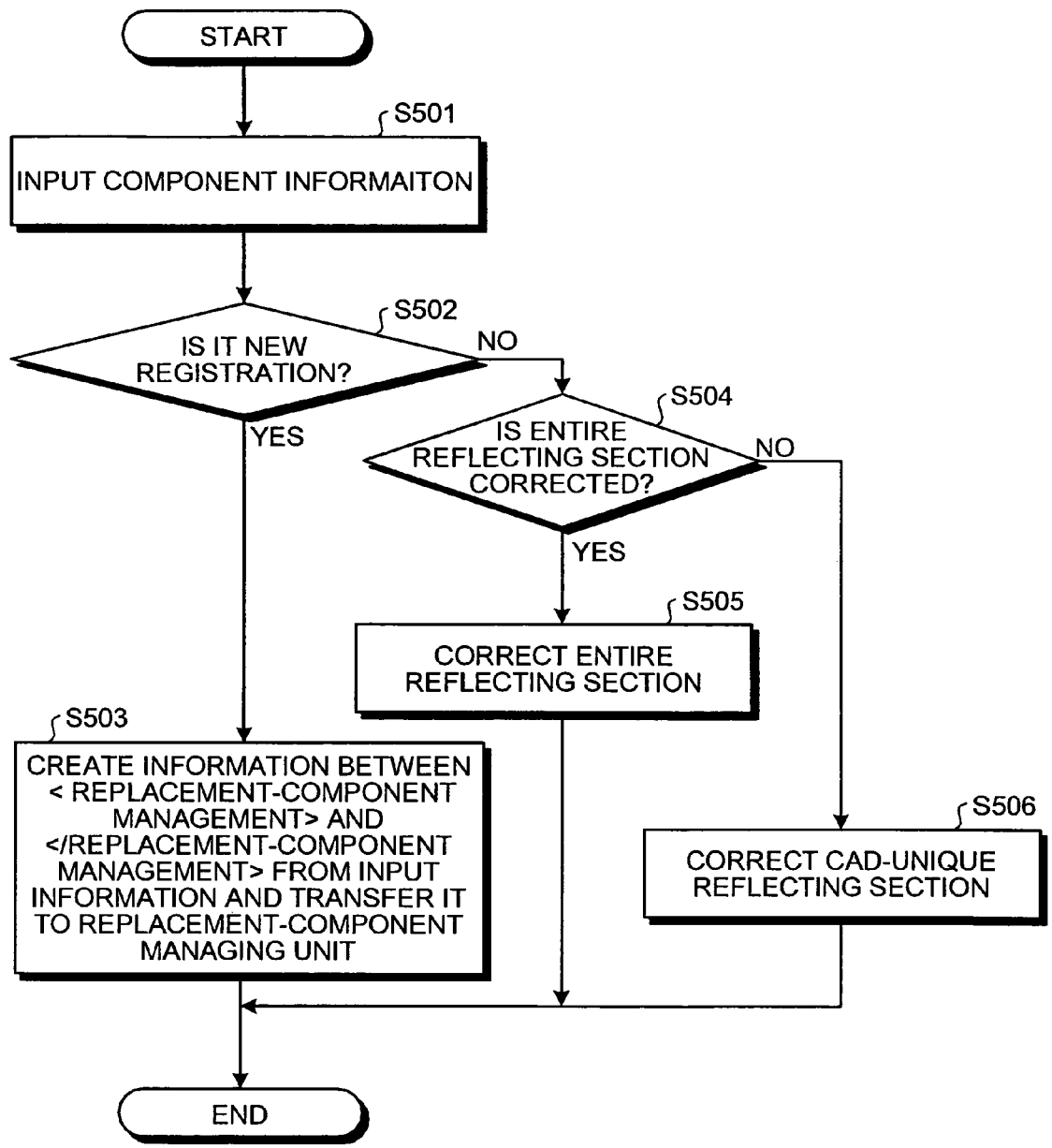
FIG. 17 is a flowchart of a process performed by the replacement-component-information registering unit.

FIG. 17 is a flowchart of a process performed by the replacement-component-information registering unit 280. The replacement-component-information registering unit 280 inputs component information of each component in the electrical CAD system and the mechanical CAD system (step S501). For example, the replacement-component-information registering unit 280 inputs the component identifier in the electrical CAD system, the shape library name in the electrical CAD system, the name of the mechanical CAD system, the component identifier in the mechanical CAD system, and the difference between the coordinates in the electrical CAD system and the mechanical CAD system (difference in X, Y, and Z directions and difference of rotating angle) with respect to each component.

The replacement-component-information registering unit 280 determines whether the component is registered for the first time using the component identifier in the electrical CAD system (step S502). If it is the first registration, the replacement-component-information registering unit 280 creates new information between <replacement-component management> and </replacement-component management>, and requests the replacement-component managing unit 250 to register it (step S503).

If it is not the first registration, the replacement-component-information registering unit 280 determines whether the entire reflecting section is to be corrected (step S504). If the entire reflecting section is to be corrected, the replacement-component-information registering unit 280 corrects the entire reflecting section between <replacement-component management> and </replacement-component management> (step S505). If not the entire reflecting section is to be corrected, the CAD-unique reflecting section between <replacement-component management> and </replacement-component management> (step S506).

In this manner, the replacement-component-information registering unit 280 registers the information of the component in the electrical CAD system and the information of the component in the mechanical CAD system associated with each other and thereby the component information in the electrical CAD system is converted into the component information in the mechanical CAD system.

As described above, according to the embodiment, when the base plane specified by the user includes a plurality of levels, i.e., when a component is mounted on the printed circuit board specified by the user, the calculation-basis determining unit 140 determines whether to use a single calculation basis (the level of the printed circuit board) or a plurality of calculation bases (levels of the printed circuit board and the component) to calculate the height limit based on the setup information. If a single calculation basis is to be used, the component mounted on the printed circuit board is removed, and the maximum-height calculating unit 160 calculates the height limit from the base plane determined by the calculation-basis determining unit 140. As a result, no matter the printed circuit board includes any component mounted thereon, the height-limited-area information is created based on the level of the printed circuit board or the levels of the printed circuit board and the component.

Moreover, according to the embodiment, the area dividing unit 150 equally divides the base plane, and the maximum-height calculating unit 160 calculates the height limit with respect to each unit. As a result, the height limit in the free-form chassis can be calculated.

Furthermore, according to the embodiment, the maximum-height calculating unit 160 creates a clip plane on the base plane of the printed circuit board, determines the view so that an image faces the base plane and that the normal line of the base plane corresponds to the depth, and forms the three-dimensional image of the chassis component narrowed down to the determined view. The maximum-height calculating unit 160 selects one of the unit areas, converts the coordinate of each vertex of the selected unit area into an image coordinate, and identifies the component at the position corresponding to the converted coordinate and the polygon. The maximum-height calculating unit 160 calculates the distance from the vertex to the polygon as the height, and uses the least value of the heights calculated from the four vertexes as the maximum height. As a result, the maximum-height calculating unit 160 calculates the maximum height at a high speed compared with acquiring the polygon to which the distance is calculated by determining whether the cross point of the vertical line from the vertex and the polygon is within the polygon.

Furthermore, according to the embodiment, the IDF input unit 220 reads the IDF created by the electrical CAD machine 20 to store it in the model-information storing unit 230, the component-information converting unit 240 converts the component information of the electrical component in the model-information storing unit 230 into the component information for the mechanical CAD system using the replacement-component information, and the IDF output unit 290 outputs the IDF converted into the component information for the mechanical CAD system. As a result, the mechanical CAD machine 10 performs an interference check more accurately by reading the IDF output from the shape detailing device 200. Moreover, because the mechanical CAD machine 10 uses the three-dimensional model information with higher accuracy, the height-limited-area-information creating device 100 creates more accurate height limit information.

While the explanation of the embodiment was made based on the height-limited-area-information creating device 100 and the shape detailing device 200, by realizing the configurations of the height-limited-area-information creating device 100 and the shape detailing device 200 using software, a height-limited-area-information creating program and a shape detailing program with equivalent functions can be acquired. A computer that executes the height-limited-area-information creating program is explained below. An equivalent computer can also execute the shape detailing program.

Figure 18:
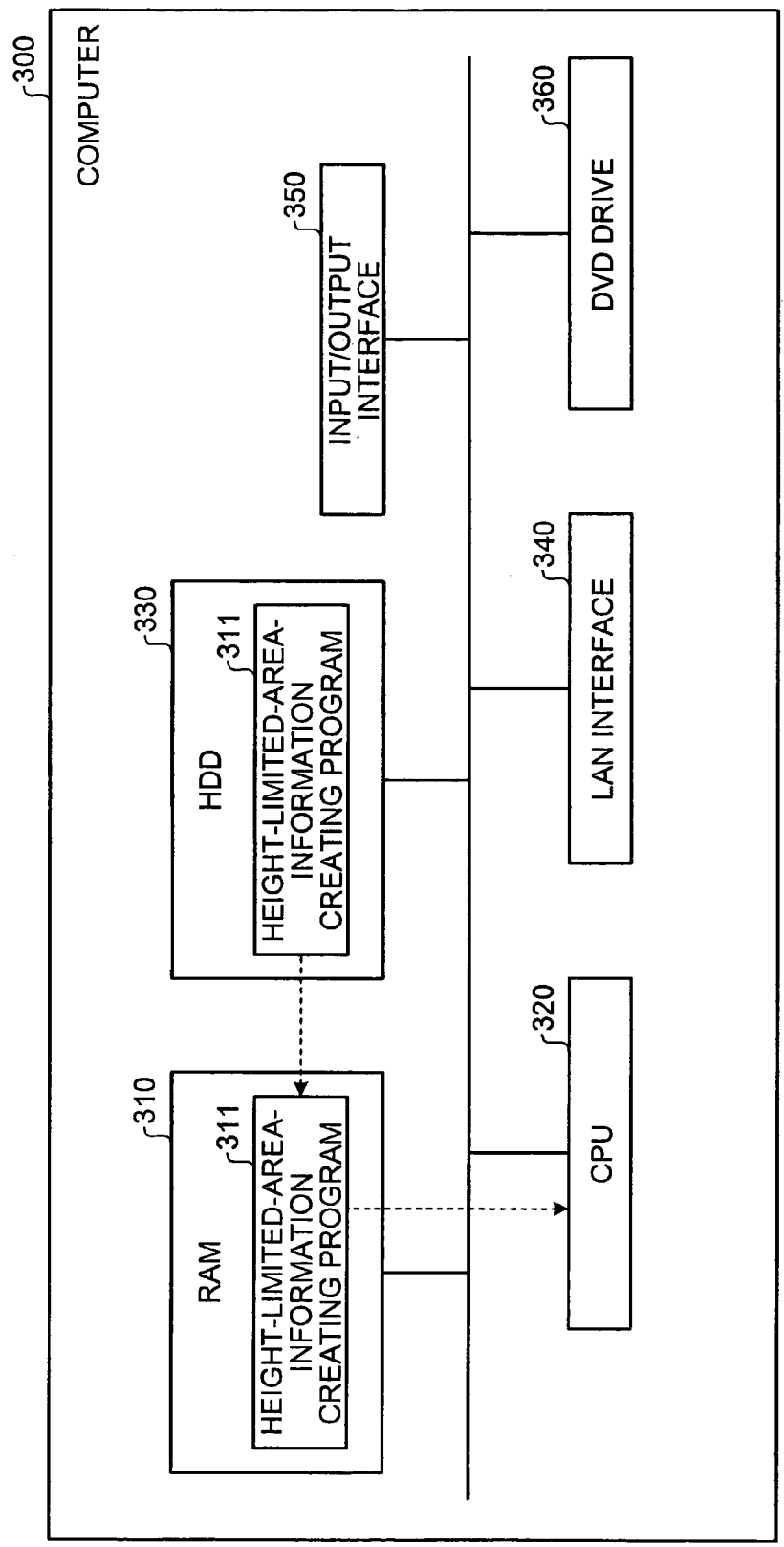
FIG. 18 is a function block diagram of a computer that executes a height-limited-area-information creating program according to the embodiment.

FIG. 18 is a function block diagram of the computer that executes the height-limited-area-information creating program according to the embodiment. A computer 300 includes a random access memory (RAM) 310, a central processing unit (CPU) 320, a hard disk drive (HDD) 330, a local area network (LAN) interface 340, an input/output interface 350, and a digital versatile disk (DVD) drive 360.

The RAM 310 stores therein programs and interim results from the programs. The CPU 320 reads a program from the RAM 310 and executes it. The HDD 330 stores therein programs and data. The LAN interface 340 is used to connect the computer 300 to another computer via a LAN. The input/output interface 350 is used to connect an input device such as a mouse and a keyboard to a display unit. The DVD drive 360 reads data from a DVD and writes data to the DVD.

A height-limited-area-information creating program 311 executed by the computer 300 is stored in a DVD, read by the DVD drive 360 from the DVD, and installed into the computer 300. Otherwise, the height-limited-area-information creating program 311 can be stored in a database in another computer connected via the LAN interface 340, read from the database, and installed into the computer 300. The installed height-limited-area-information creating program 311 is stored in the HDD 330, read by the RAM 310, and executed by the CPU 320.

While the embodiment has been explained assuming that the height-limited-area-information creating device 100 and the shape detailing device 200 are independent from the mechanical CAD machine 10 and the electrical CAD machine 20, the functions of the height-limited-area-information creating device 100 and the shape detailing device 200 can be included in the mechanical CAD machine 10 or the electrical CAD machine 20. For example, the functions of the shape detailing device 200 can be included in the mechanical CAD machine 10. However, if it is the case, the mechanical CAD machine 10 creates the shape and arranges the component using the converted component information without outputting the converted component information in the IDF format. Otherwise, the functions of both the shape detailing device 200 and the height-limited-area-information creating device 100 can be combined to form the mechanical CAD-electrical CAD interaction supporting system.

Also, while the embodiment has been explained assuming that the height limit information for the space in the chassis is created based on the printed circuit board of the information processing device, the present invention can be applied in the same manner when the height limit information for the space in a building is created based on a floor of the building.

As set forth hereinabove, according to an embodiment of the present invention, the 2.5-dimensional shape information in the electrical CAD system is converted into the three-dimensional shape information in the mechanical CAD system. Thus, a highly accurate three-dimensional model can be created based on the information generated by the electrical CAD system. Besides, the misalignment of the structure in the mechanical CAD system is prevented, and therefore, a user does not need to correct the misalignment.

Moreover, because the coordinate difference common to mechanical CAD systems is efficiently stored, a storage area for the coordinate difference can be reduced. Furthermore, the height-limited-area information is generated with high accuracy, which enables the result of design by the mechanical CAD system to be correctly reflected to the electrical CAD system.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A shape detailing device comprising:
a storage unit that stores therein association information including an identifier of each structure that forms a three-dimensional structure in an electrical computer-aided design (CAD) system and an identifier of the structure in a mechanical CAD system associated with each other, and further stores therein a coordinate difference between the electrical CAD system and the mechanical CAD system, the coordinate difference including a difference between an origin of a three-dimensional coordinate of the electrical CAD system and an origin of a three-dimensional coordinate of the mechanical CAD system; and
a converting unit that converts shape information of the structure created by the electrical CAD system into shape information for the mechanical CAD system based on the association information and converts a coordinate value based on the coordinate difference.

2. The shape detailing device according to claim 1, wherein the storage unit stores therein coordinate difference unique to each mechanical CAD system for a structure with shape information unique to the mechanical CAD system, and stores therein common coordinate difference for a structure with shape information common to all mechanical CAD systems.

3. The shape detailing device according to claim 1, wherein
the three-dimensional structure is a device that includes a plurality of components including a printed circuit board and a chassis,
the identifier of the structure is an component identifier of each component, and
the converting unit converts shape information of a component of the device created by the electrical CAD system into shape information for the mechanical CAD system based on the association information.

4. A shape detailing method comprising:
storing association information including an identifier of each structure that forms a three-dimensional structure in an electrical computer-aided design (CAD) system and an identifier of the structure in a mechanical CAD system associated with each other, and storing coordinate difference between the electrical CAD system and the mechanical CAD system, the coordinate difference including a difference between an origin of a three-dimensional coordinate of the electrical CAD system and an origin of a three-dimensional coordinate of the mechanical CAD system;
converting, using a computer, shape information of the structure created by the electrical CAD system into shape information for the mechanical CAD system based on the association information, and
converting, using the computer, a coordinate value based on the coordinate difference.

5. The shape detailing method according to claim 4, wherein the storing includes storing coordinate difference unique to each mechanical CAD system for a structure with shape information unique to the mechanical CAD system, and storing common coordinate difference for a structure with shape information common to all mechanical CAD systems.

6. The shape detailing method according to claim 4, wherein
the three-dimensional structure is a device that includes a plurality of components including a printed circuit board and a chassis,
the identifier of the structure is an component identifier of each component, and
the converting includes converting shape information of a component of the device created by the electrical CAD system into shape information for the mechanical CAD system based on the association information.

7. A computer-readable recording medium that stores therein a computer program that causes a computer to execute:
storing association information including an identifier of each structure that forms a three-dimensional structure in an electrical computer-aided design (CAD) system and an identifier of the structure in a mechanical CAD system associated with each other, and
storing coordinate difference between the electrical CAD system and the mechanical CAD system, the coordinate difference including a difference between an origin of a 3 dimensional coordinate of the electrical CAD system and an origin of a 3 dimensional coordinate of the mechanical CAD system; and
converting shape information of the structure created by the electrical CAD system into shape information for the mechanical CAD system based on the association information, and
converting a coordinate value based on the coordinate difference.

8. The computer-readable recording medium according to claim 7, wherein the storing includes storing coordinate difference unique to each mechanical CAD system for a structure with shape information unique to the mechanical CAD system, and storing common coordinate difference for a structure with shape information common to all mechanical CAD systems.

9. The computer-readable recording medium according to claim 7, wherein
the three-dimensional structure is a device that includes a plurality of components including a printed circuit board and a chassis,
the identifier of the structure is an component identifier of each component, and
the converting includes converting shape information of a component of the device created by the electrical CAD system into shape information for the mechanical CAD system based on the association information.

10. A mechanical computer-aided design (CAD) machine comprising:
a storage unit that stores therein association information including an identifier of each structure that forms a three-dimensional structure in an electrical CAD system and an identifier of the structure in a mechanical CAD system associated with each other, and a coordinate difference between the electrical CAD system and the mechanical CAD system, the coordinate difference including a difference between an origin of a three-dimensional coordinate of the electrical CAD system and an origin of a three-dimensional coordinate of the mechanical CAD system;
a converting unit that converts shape information of the structure created by the electrical CAD system into shape information for the mechanical CAD system based on the association information and converts a coordinate value based on the coordinate difference; and
a height-limited-area-information creating unit that creates height-limited-area information for a space formed when a plurality of structures are combined and laid out to form the three-dimensional structure, the shape information of at least one of the structures having been converted into the shape information for the mechanical CAD system.

11. A method of manufacturing a three-dimensional structure design of which is supported by a computer-aided design (CAD)-interaction supporting system that supports an interaction between an electrical CAD system and a mechanical CAD system, the method comprising:
storing association information including an identifier of each structure that forms a three-dimensional structure in the electrical CAD system and an identifier of the structure in the mechanical CAD system associated with each other, and a coordinate difference between the electrical CAD system and the mechanical CAD system, the coordinate difference including a difference between an origin of a 3 dimensional coordinate of the electrical CAD system and an origin of a 3 dimensional coordinate of the mechanical CAD system; and
converting, using a computer, shape information of the structure created by the electrical CAD system into shape information for the mechanical CAD system based on the association information, the converting including converting a coordinate value based on the coordinate difference.

* * * * *